(12) United States Patent
Marukame et al.

(10) Patent No.: US 10,891,108 B2
(45) Date of Patent: Jan. 12, 2021

(54) CALCULATION DEVICE

(71) Applicant: KABUSHIKI KAISHA TOSHIBA, Minato-ku (JP)

(72) Inventors: Takao Marukame, Chuo (JP); Yoshifumi Nishi, Yokohama (JP); Kumiko Nomura, Shinagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 155 days.

(21) Appl. No.: 16/294,980

(22) Filed: Mar. 7, 2019

(65) Prior Publication Data

US 2020/0026496 A1    Jan. 23, 2020

(30) Foreign Application Priority Data

Jul. 19, 2018   (JP) ................. 2018-136058

(51) Int. Cl.
```
G06F 7/544      (2006.01)
G11C 13/00      (2006.01)
G06N 3/04       (2006.01)
```
(52) U.S. Cl.
CPC .......... G06F 7/5443 (2013.01); G11C 13/004 (2013.01); G11C 13/0069 (2013.01); G06N 3/04 (2013.01)

(58) Field of Classification Search
None
See application file for complete search history.

(56) References Cited

U.S. PATENT DOCUMENTS

| 10,175,947 | B1 | 1/2019 | Marukame et al. |
| 2012/0016829 | A1* | 1/2012 | Snider ............... G06N 3/063 706/27 |

(Continued)

FOREIGN PATENT DOCUMENTS

| JP | 02-236659 | 9/1990 |
| JP | 02-292602 | 12/1990 |

(Continued)

OTHER PUBLICATIONS

Geoffrey W. Burr, "Analog resistive neuromorphic hardware", IBM Research—Almaden., BioComp Summer School, Jun. 30, 2017, 135 pages.

*Primary Examiner* — Michael D. Yaary
(74) *Attorney, Agent, or Firm* — Oblon, McClelland, Maier & Neustadt, L.L.P.

(57) ABSTRACT

A calculation device includes: M coefficient storage units provided corresponding to the M coefficients, each of the M coefficient storage units including a positive-side coefficient and a negative-side coefficient representing a coefficient corresponding to a sign of a difference; M multiplication units provided corresponding to the M input values, each of the M multiplication units calculating a positive-side multiply value obtained by multiplying the positive-side coefficient included in the corresponding coefficient storage unit by a sign inverted according to the corresponding input value and a negative-side multiply value obtained by multiplying the negative-side coefficient included in the corresponding coefficient storage unit by a sign inverted according to the corresponding input value; and an output unit outputting an value according to a difference between a positive-side sum value obtained by summing the M positive-side multiplication values and a negative-side sum (Continued)

value obtained by summing the M negative-side multiplication values.

12 Claims, 15 Drawing Sheets

(56) References Cited

U.S. PATENT DOCUMENTS

| | | | |
|---|---|---|---|
| 2015/0088797 A1 | 3/2015 | Kim et al. | |
| 2016/0336064 A1* | 11/2016 | Seo | G06N 3/088 |
| 2019/0294413 A1* | 9/2019 | Vantrease | G06F 7/5443 |

FOREIGN PATENT DOCUMENTS

| | | |
|---|---|---|
| JP | 05-204885 | 8/1993 |
| JP | 2019-53563 A | 4/2019 |

* cited by examiner

CALCULATION DEVICE

CROSS-REFERENCE TO RELATED APPLICATIONS

This application is based upon and claims the benefit of priority from Japanese Patent Application No. 2018-136058, filed on Jul. 19, 2018; the entire contents of which are incorporated herein by reference.

FIELD

Embodiments described herein relate generally to a calculation device.

BACKGROUND

Techniques using a neural network are known. In addition, techniques for configuring a neural network by using dedicated hardware have also been studied.

In each unit included in the neural network, a product sum calculation (multiplication accumulation) is executed. That is, in each unit, each of a plurality of input values received from the unit at the preceding stage is multiplied by a coefficient, and the plurality of input values after multiplication by the coefficient are added. In addition, in each unit, the calculated value is supplied to the activation function. Then, each unit outputs the output value of the activation function.

Meanwhile, a neural network device realized by hardware needs to have many such units. For this reason, in the case of realizing the neural network by hardware, it is preferable to realize the product sum calculation in each unit with high accuracy with a simple process.

DETAILED DESCRIPTION

According to an embodiment, a calculation device performing a product sum calculation of M input values (M is an integer of 2 or more) and M coefficients corresponding to the M input values on a one-to-one basis, the calculation device includes M coefficient storage units, M multiplication units, and an output unit. The M coefficient storage units are provided corresponding to the M coefficients, each of the M coefficient storage units include a positive-side coefficient and a negative-side coefficient. A corresponding coefficient being represented a sign of a difference between the positive-side coefficient and the negative-side coefficient. The M multiplication units are provided corresponding to the M input values, each of the M multiplication units is configured to calculate a positive-side multiplication value obtained by multiplying the positive-side coefficient included in the corresponding coefficient storage unit by a sign inverted according to the corresponding input value and a negative-side multiplication value obtained by multiplying the negative-side coefficient included in the corresponding coefficient storage unit by a sign inverted according to the corresponding input value. The output unit is configured to output an output value according to a difference between a positive-side product sum calculation value obtained by summing the M positive-side multiplication values and a negative-side product sum calculation value obtained by summing the M negative-side multiplication values.

Hereinafter, a calculation device 10 according to an embodiment will be described in detail with reference to the drawings. The calculation device 10 realizes nonlinear computation simulating neurons with a simple configuration.

Embodiment

Figure 1:
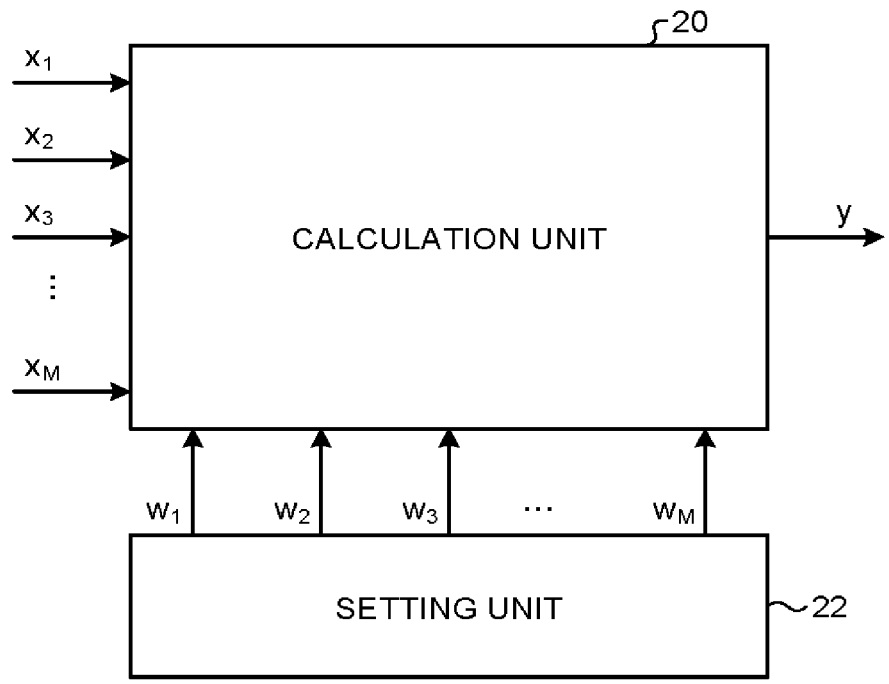
FIG. 1 is a configuration diagram of a calculation device according to an embodiment.

FIG. 1 is a diagram illustrating a configuration of a calculation device 10 according to the embodiment. The calculation device 10 includes a calculation unit 20 and a setting unit 22.

The calculation unit 20 receives M input values each of which is represented by a binary value and M coefficients each of which is represented by a binary value. M is an integer of 2 or more. The M coefficients correspond to M input values on a one-to-one basis.

The setting unit 22 receives the M coefficients from, for example, an external learning device or the like. The setting unit 22 stores the M coefficients in the inside of the calculation unit 20. The calculation unit 20 has a plurality of nonvolatile memory type cells therein. The setting unit 22 stores the M coefficients in the plurality of nonvolatile memory type cells.

The calculation unit 20 receives M input values from other units. Upon receiving the M input values, the calculation unit 20 performs a product sum calculation (multiplication accumulation) on the received M input values and the M coefficients stored therein. Then, the calculation unit 20 outputs an output value represented by a binary value as a result of the product sum calculation.

In the embodiment, the M input values are denoted by $x_1$, $x_2$, $x_3$, ..., and $x_M$. In addition, in the embodiment, the M coefficients are denoted by $w_1$, $w_2$, $w_3$, ..., and $w_M$. In the embodiment, the output value is denoted by y. Subscripts indicate indexes. The input value and coefficient attached with the same index correspond to each other. That is, $x_1$ and $w_1$ correspond to each other, $x_2$ and $w_2$ correspond to each other, and $x_M$ and $w_M$ correspond to each other. In addition, an input value with an arbitrary indexes denoted by $x_i$, and a coefficient with an arbitrary indexes denoted by $w_i$. i is an integer from 1 to M.

Figure 2:
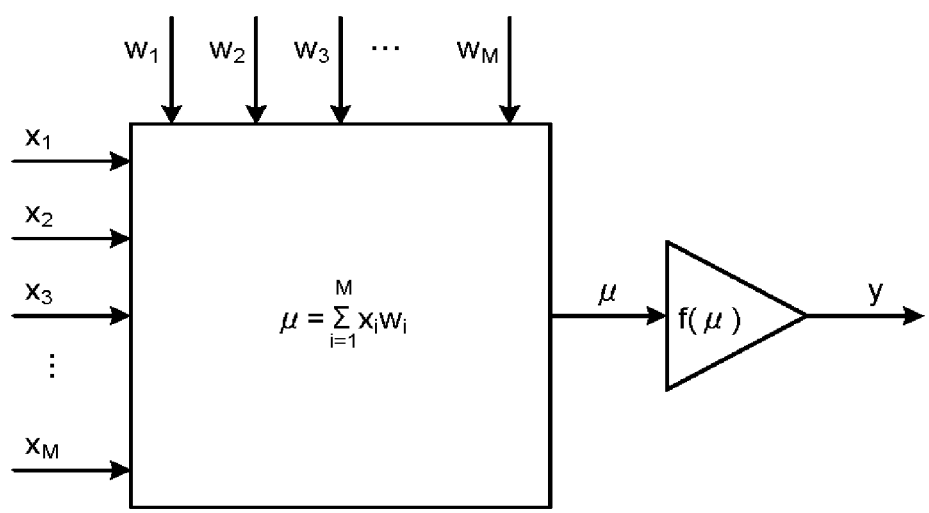
FIG. 2 is an explanatory diagram of a content of a calculation process by the calculation device.

FIG. 2 is a diagram illustrating a content of a calculation process by the calculation device 10.

In the embodiment, each of the M input values represents a value of one of −1 and +1, as expressed by the following Equation (1).

$$x_i = \{-1, +1\} \qquad (1)$$

In the embodiment, each of the M coefficients represents a value of one of −1 and +1 as expressed by the following Equation (2).

$$w_i = \{-1, +1\} \qquad (2)$$

In the embodiment, the output value represents a value of one of −1 and +1, as expressed by the following Equation (3).

$$y = \{-1, +1\} \qquad (3)$$

In a case where M input values are received, the calculation unit 20 executes a product sum calculation of M input values and M coefficients by an analog process. For example, μ calculated by the following Equation (4) is referred to as an intermediate value.

$$\mu = \sum_{i=1}^{M} X_i W_i \qquad (4)$$

In addition, a dot denotes multiplication.

The intermediate value denotes a value of a predetermined number of bits obtained by accumulating M multiplication values obtained by multiplying each of the M input values by corresponding coefficients. The calculation unit 20 performs a sign function process on the signal representing such an intermediate value to generate a binary output value. That is, the calculation unit 20 executes the calculation process of the following Equation (5) on the signal representing the intermediate value.

$$Y = f(\mu) \qquad (5)$$

In addition, f( ) denotes a sign function. y denotes a value of the output value.

In a case where the argument (intermediate value) is smaller than 0, the sign function outputs −1, and in a case where the argument (intermediate value) is equal to or larger than 0, the sign function outputs +1. That is, the sign function is a function as expressed by the following Equation (6).

$$f(\mu) = \begin{cases} -1, & \mu < 0 \\ +1, & \mu \geq 0 \end{cases} \qquad (6)$$

Figure 3:
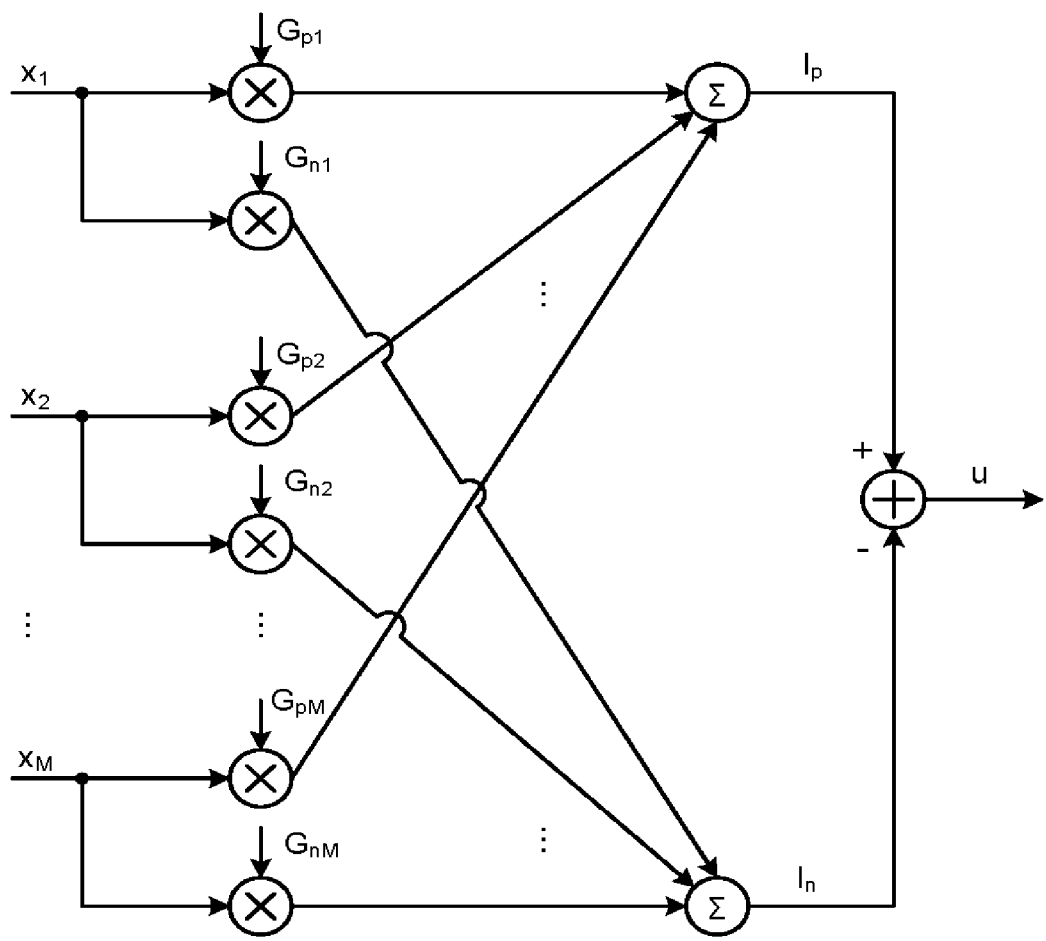
FIG. 3 is an explanatory diagram of a product sum calculation process executed by a calculation unit.

FIG. 3 is a diagram illustrating a product sum calculation process executed by the calculation unit 20 according to the embodiment.

In the embodiment, each of the M coefficients is represented by the sign (positive or negative) of the difference between the positive-side coefficient and the negative-side coefficient. That is, $w_i$ is expressed by the following Equation (7).

$$w_i = f(G_{pi} - G_{ni}) \qquad (7)$$

$G_{pi}$ is a positive-side coefficient. $G_{ni}$ is a negative-side coefficient.

The positive-side coefficient ($G_{pi}$) and the negative-side coefficient ($G_{ni}$) are changed in a magnitude relationship according to the corresponding coefficient. For example, in a case where $w_i = +1$, $G_{pi} > G_{ni}$. In addition, for example, in a case where $w_i = -1$, $G_{pi} < G_{ni}$.

Furthermore, in the embodiment, the calculation unit 20 calculates the intermediate value (μ) by executing a calculation process of the following Equation (8).

$$\mu = I_p - I_n \qquad (8)$$

$I_p$ is a positive-side product sum calculation value obtained by summing M positive-side multiplication values. The positive-side multiplication value is calculated for each of the M input values. Specifically, the i-th positive-side multiplication value is a value obtained by multiplying the corresponding positive-side coefficient ($G_{pi}$) by the sign ($x_i$) inverted according to the corresponding input value. That is, the calculation unit 20 calculates the positive-side product sum calculation value ($I_p$) by executing a calculation process of the following Equation (9).

$$I_p = \{x_1 \cdot G_{p1} + x_2 \cdot G_{p2} + \ldots + x_M \cdot G_{pM}\} \qquad (9)$$

$I_n$ is a negative-side product sum calculation value obtained by summing the M negative-side multiplication values. The negative-side multiplication value is calculated for each of the M input values. Specifically, the i-th negative-side multiplication value is a value obtained by multiplying the corresponding negative-side coefficient ($G_{ni}$) by the sign ($x_i$) inverted according to the corresponding input value. That is, the calculation unit 20 executes the calculation process of the following Equation (10) to calculate the negative-side product sum calculation value ($I_n$).

$$I_n = \{x_1 \cdot G_{n1} + x_2 \cdot G_{n2} + \ldots + x_M \cdot G_{nM}\} \qquad (10)$$

Therefore, values of the positive-side coefficient ($G_{pi}$) and the negative-side coefficient ($G_{ni}$) may be any values as long as the values are positive values. The values of the positive-side coefficient ($G_{pi}$) and negative-side coefficient ($G_{ni}$) may be different for each index. However, the absolute value ($|G_{pi} - G_{ni}|$) of the difference between the positive-side coefficient and the negative-side coefficient is set to a predetermined value. However, the absolute value ($|G_{pi} - G_{ni}|$) of the difference between the positive-side coefficient and the negative-side coefficient may vary as long as the value does not affect the operation accuracy of the product sum calculation.

Figure 4:
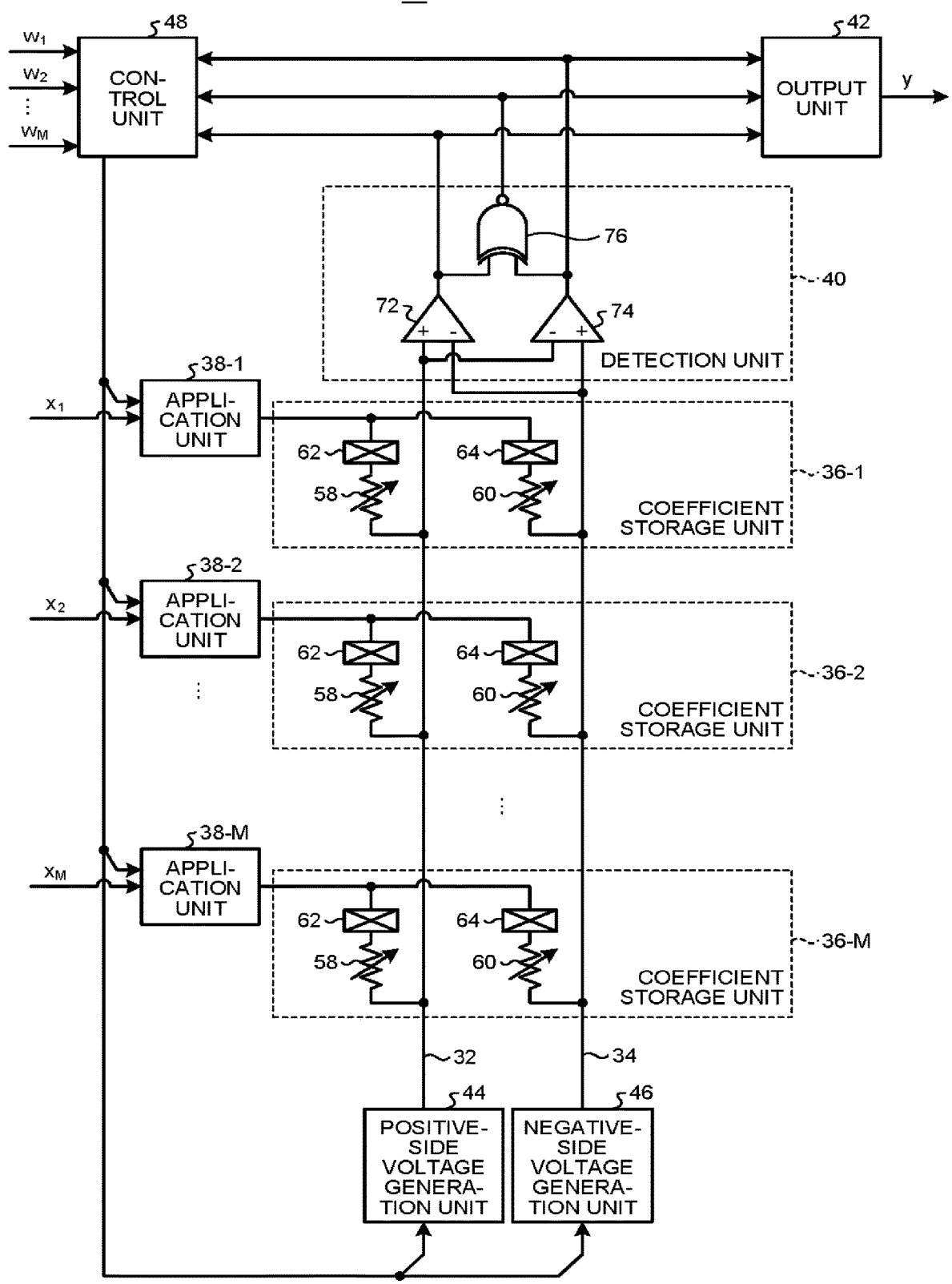
FIG. 4 is a hardware configuration diagram of a calculation unit according to the embodiment.

FIG. 4 is a diagram illustrating a hardware configuration of the calculation unit 20 according to the embodiment. The calculation unit 20 operates in the calculation mode, the initialization mode, or the setting mode.

In the calculation mode, the calculation unit 20 performs a product sum calculation of the M input values acquired from the outside and the M coefficients stored in the inside. In the initialization mode, the calculation unit 20 initializes the M coefficients stored in the inside. In the setting mode, the calculation unit 20 acquires the M coefficients from the outside and stores therein the acquired coefficients.

The calculation unit 20 includes M coefficient storage units 36 (36-1 to 36-M), M application units 38 (38-1 to 38-M), a detection unit 40, an output unit 42, a positive-side voltage generation unit 44, a negative-side voltage generation unit 46, and a control unit 48.

The M coefficient storage units 36 are provided corresponding to the M coefficients. Each of the M coefficient storage units 36 includes a positive-side resistor 58, a negative-side resistor 60, a positive-side rectification unit 62, and a negative-side rectification unit 64.

A conductance of the positive-side resistor 58 represents a positive-side coefficient ($G_{pi}$). In addition, a conductance of the negative-side resistor 60 represents a negative-side coefficient ($G_{ni}$). Accordingly, the positive-side resistor 58 and the negative-side resistor 60 represent the coefficients ($w_i$) corresponding to the sign of the difference between the conductances.

In addition, the positive-side resistor 58 and the negative-side resistor 60 are resistance change type memories. In a case where a read voltage which is a predetermined voltage is applied, the resistance change type memory functions as a normal resistor while retaining the resistance value. However, in a case where a write voltage equal to or higher than a predetermined threshold value higher than the read voltage is applied to the resistance change type memory, the conductance (reciprocal of the resistance value) is changed to a value corresponding to a voltage application time, a current amount, or the like.

The positive-side resistor 58 and the negative-side resistor 60 function as nonvolatile memories that store information (conductance). Therefore, the positive-side resistor 58 functions as a storage unit that stores the positive-side coefficient ($G_{pi}$). In addition, the negative-side resistor 60 functions as a storage unit that stores the negative-side coefficient ($G_{ni}$). Accordingly, each of the M coefficient storage units 36 functions as a storage unit that stores the positive-side coefficient ($G_{pi}$) and the negative-side coefficient ($G_{ni}$).

The positive-side rectification unit 62 prevents the reverse flow of the current flowing in the positive-side resistor 58. For example, in a case where a positive voltage is applied to the positive-side resistor 58 by the application unit 38, the positive-side rectification unit 62 prevents a reverse current from flowing in the positive-side resistor 58, and in a case where a negative voltage is applied to the positive-side resistor 58 by the application unit 38, the positive-side rectification unit 62 prevents a forward current from flowing in the positive-side resistor 58.

The negative-side rectification unit 64 prevents the reverse flow of the current flowing in the negative-side resistor 60. For example, in a case where a positive voltage is applied to the negative-side resistor 60 by the application unit 38, the negative-side rectification unit 64 prevents a reverse current from flowing in the negative-side resistor 60, and in a case where a negative voltage is applied to the negative-side resistor 60 by the application unit 38, the negative-side rectification unit 64 prevents a forward current from flowing in the negative-side resistor 60.

One end of the positive-side resistor 58 is connected to the positive-side bit line 32, and the other end thereof is connected to the application unit 38 via the positive-side rectification unit 62. In addition, one end of the negative-side resistor 60 is connected to the negative-side bit line 34, and the other end thereof is connected to the application unit 38 via the negative-side rectification unit 64. In the calculation mode, each of the M coefficient storage units 36 outputs a positive-side current to the positive-side bit line 32 and outputs a negative-side current to the negative-side bit line 34 in response to the generation of the read voltage from the application unit 38.

The M application units 38 are provided corresponding to the M input values. In the calculation mode, each of the M application units 38 acquires a corresponding input value among the M input values.

In the calculation mode, each of the M application units 38 applies a voltage according to the corresponding input value to the positive-side resistor 58 and the negative-side resistor 60 included in the corresponding coefficient storage unit 36. Accordingly, each of the M application units 38 can change the magnitude relationship between the positive-side current and the negative-side current output from the corresponding coefficient storage unit 36 according to the multiplication result of the corresponding input value and the corresponding coefficient.

In the embodiment, each of the M application units 38 applies a read voltage of which polarity is reversed according to the corresponding input value to the positive-side resistor 58 and the negative-side resistor 60 included in the corresponding coefficient storage unit 36. Then, each of the M application units 38 outputs the current flowing in the positive-side resistor 58 as a positive-side current from the coefficient storage unit 36 and outputs the current flowing in the negative-side resistor 60 as a negative-side current from the coefficient storage unit 36. Accordingly, each of the M application units 38 can change the magnitude relationship between the positive-side current and the negative-side current output from the corresponding coefficient storage unit 36 according to the multiplication result of the corresponding input value and the corresponding coefficient.

Herein, the positive-side current represents a positive-side multiplication value obtained by multiplying the positive-side coefficient by a sign inverted according to the corresponding input value. In addition, the negative-side current represents a negative-side multiplication value obtained by multiplying the negative-side coefficient by a sign inverted according to the corresponding input value. Accordingly, each of the M application units 38 can function as a multiplication unit that calculate a positive-side multiplication value obtained by multiplying the positive-side coefficient included in the corresponding coefficient storage unit 36 by a sign inverted according to the corresponding input value and a negative-side multiplication value obtained by multiplying the negative-side coefficient included in the corresponding coefficient storage unit 36 by a sign inverted according to the corresponding input value.

The detection unit 40 compares the positive-side total current obtained by summing the positive-side currents output from the M coefficient storage units 36 and the negative-side total current obtained by summing the negative-side currents output from the M coefficient storage units 36.

The positive-side total current obtained by summing the positive-side currents output from the M coefficient storage units 36 flows in the positive-side bit line 32. In addition, the negative-side total current obtained by summing the negative-side currents output from the M coefficient storage units 36 flows in the negative-side bit line 34. Therefore, the detection unit 40 compares the current flowing in the positive-side bit line 32 with the current flowing in the negative-side bit line 34. Then, the detection unit 40 detects whether the positive-side total current is equal to or larger than the negative-side total current, whether the negative-side total current is larger than the positive-side total current, and whether the positive-side total current and the negative-side total current are equal to each other.

In the embodiment, the detection unit 40 includes a positive-side comparison unit 72, a negative-side comparison unit 74, and an equality determination unit 76. The positive-side comparison unit 72 determines whether or not the current (positive-side total current) flowing in the positive-side bit line 32 is larger than the current (negative-side total current) flowing in the negative-side bit line 34. The negative-side comparison unit 74 determines whether or not the current (negative-side total current) flowing in the negative-side bit line 34 is larger than the current (positive-side total current) flowing in the positive-side bit line 32. The equality determination unit 76 determines whether or not the current (positive-side total current) flowing in the positive-side bit line 32 and the current (negative-side total current) flowing in the negative-side bit line 34 are equal to each other within a predetermined range.

Operations of the positive-side comparison unit 72, the negative-side comparison unit 74, and the equality determination unit 76 will be further described with reference to FIG. 10.

In the calculation mode, the output unit 42 outputs an output value corresponding to the difference between the positive-side total current and the negative-side total current. In the embodiment, in a case where the positive-side total current is equal to or larger than the negative-side total current, the output unit 42 outputs an output value (y) of +1, and in a case where the positive-side total current is smaller than the negative-side total current, the output unit 42 outputs an output value (y) of −1.

For example, in a case where the equality determination unit 76 determines that the positive-side total current and the negative-side total current are equal to each other, or in a case where the positive-side comparison unit 72 determines that the positive-side total current is larger than the negative-side total current, the output unit 42 outputs an output value of +1. In addition, for example, in a case where the equality determination unit 76 determines that the positive-side total current and the negative-side total current are not equal to each other and in a case where the negative-side comparison unit 74 determines that the negative-side total current is larger than the positive-side total current, the output unit 42 outputs an output value of −1.

Herein, the positive-side total current represents the positive-side product sum calculation value obtained by summing M positive-side multiplication values. In addition, the negative-side total current represents the negative-side product sum calculation value obtained by summing M negative-side multiplication values. Accordingly, in the calculation mode, the output unit 42 can output the output value according to the difference between the positive-side product sum calculation value obtained by summing the M positive-side multiplication values and the negative-side product sum calculation value obtained by summing the M negative-side multiplication values.

The positive-side voltage generation unit 44 applies a voltage to the positive-side bit line 32. In the calculation mode, the positive-side voltage generation unit 44 applies a reference voltage (for example, ground potential) to the positive-side bit line 32. A potential difference between the voltage generated from the corresponding application unit 38 and the voltage generated from the positive-side voltage generation unit 44 is applied to the positive-side resistor 58. Therefore, in the calculation mode, the read voltage generated by the application unit 38 is applied to the positive-side resistor 58.

In addition, in the case of changing the resistance value of the positive-side resistor 58, the positive-side voltage generation unit 44 applies a voltage lower than the reference voltage to the positive-side bit line 32 under the control of the control unit 48. Therefore, in the case of changing the resistance value, a write voltage higher than the read voltage is applied to the positive-side resistor 58.

The negative-side voltage generation unit 46 applies a voltage to the negative-side bit line 34. In the calculation mode, the negative-side voltage generation unit 46 applies a reference voltage (for example, ground potential) to the negative-side bit line 34. A potential difference between the voltage generated from the corresponding application unit 38 and the voltage generated from the negative-side voltage generation unit 46 is applied to the negative-side resistor 60. Therefore, in the calculation mode, the read voltage generated by the application unit 38 is applied to the negative-side resistor 60.

In addition, in the case of changing the resistance value of the negative-side resistor 60, the negative-side voltage generation unit 46 applies a voltage lower than the reference voltage to the negative-side bit line 34 under the control of the control unit 48. Therefore, in the case of changing the resistance value, a write voltage higher than the read voltage is applied to the negative-side resistor 60.

The control unit 48 controls operations of the M application units 38, the positive-side voltage generation unit 44, and the negative-side voltage generation unit 46. Specifically, in the calculation mode, the control unit 48 allows the positive-side voltage generation unit 44 and the negative-side voltage generation unit 46 to generate the reference voltage and allows each of the M application units 38 to generate a read voltage of which sign is inverted according to the corresponding input values. Accordingly, the control unit 48 allows each of the M coefficient storage units 36 to output the positive-side current and the negative-side current of which magnitude relationship is reversed according to the multiplication result of the corresponding input value and the corresponding coefficient.

In addition, in the initialization mode, the control unit 48 controls the operations of the M application units 38, the positive-side voltage generation unit 44, and the negative-side voltage generation unit 46 to allow the conductance of the positive-side resistor 58 and the conductance of the negative-side resistor 60 included in each of the M coefficient storage units 36 to be equal to each other. Accordingly, in the initialization mode, the control unit 48 can allow the positive-side coefficient and the negative-side coefficient included in each of the M coefficient storage units 36 to be equal to each other. In addition, a more detailed control operation of the control unit 48 in the initialization mode will be further described with reference to FIGS. 11 to 15.

In addition, the control unit 48 receives the M coefficients from the external learning device or the like in the setting mode. Then, in the setting mode, the control unit 48 controls the operations of the M application units 38, the positive-side voltage generation unit 44, and the negative-side voltage generation unit 46 to set the magnitude relationship between the conductance of the positive-side resistor 58 and the conductance of the negative-side resistor 60 included in the coefficient storage unit 36 among the M coefficient storage units 36 according to the corresponding coefficient.

For example, in a case where the coefficient is +1, the control unit 48 allows the conductance of the positive-side resistor 58 included in the corresponding coefficient storage unit 36 to be larger than the conductance of the negative-side resistor 60 included in the corresponding coefficient storage unit 36. In addition, in a case where the coefficient is −1, the control unit 48 allows the conductance of the positive-side resistor 58 included in the corresponding coefficient storage unit 36 to be smaller than the conductance of the negative-side resistor 60 included in the corresponding coefficient storage unit 36. Accordingly, in the setting mode, the control unit 48 sets the magnitude relationship between the positive-side coefficient and the negative-side coefficient included in the coefficient storage unit 36 of the setting target among the M coefficient storage units 36 according to the corresponding coefficient. In addition, more detailed control operations of the control unit 48 in the setting mode will be further described with reference to FIG. 16.

Figure 5:
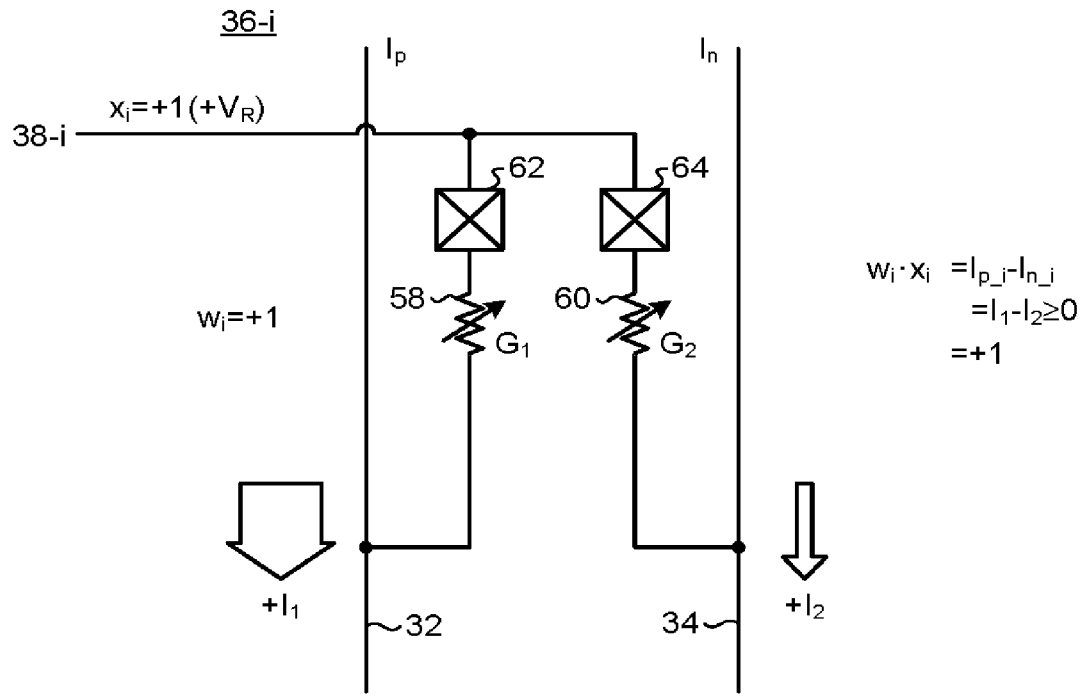
FIG. 5 is an explanatory diagram of an operation of a coefficient storage unit in a case where $w_i=+1$ and $x_i=+1$.

FIG. 5 is a diagram illustrating operations of the coefficient storage unit 36 in a case where $w_i=+1$ and $x_i=+1$. In a case where the i-th coefficient ($w_i$) is +1, the positive-side resistor 58 included in the i-th coefficient storage unit 36-$i$ is set to the first conductance ($G_1=1/R_1$). In a case where the i-th coefficient ($w_i$) is +1, the negative-side resistor 60 included in the i-th coefficient storage unit 36-$i$ is set to the second conductance ($G_2=1/R_2$).

In addition, in a case where the i-th input value ($x_i$) is +1, the application unit 38 applies a positive read voltage ($+V_R$) to the positive-side resistor 58 and the negative-side resistor 60. In such a case, a current having a positive first current value ($+I_1$) flows in the positive-side resistor 58. In addition, a current having a positive second current value ($+I_2$) flows in the negative-side resistor 60. In addition, it is assumed that $G_1 > G_2$. Therefore, $|I_1| > |I_2|$.

In addition, the current flowing in the positive-side resistor 58 is output to the positive-side bit line 32. In addition, the current flowing in the negative-side resistor 60 is output to the negative-side bit line 34.

Herein, the calculation result of the value ($w_i \cdot x_i$) obtained by multiplying the i-th coefficient ($w_i$) by the i-th input value ($x_i$) is represented by the current difference ($I_{p\_i}-I_{n\_i}$) between the current ($I_{p\_i}$) output from the i-th coefficient storage unit 36-$i$ to the positive-side bit line 32 and the current ($I_{n\_i}$) output from the i-th coefficient storage unit 36-$i$ to the negative-side bit line 34.

For this reason, in the example of FIG. 5, $I_{p\_i}=+I_1$, $I_{n\_i}=+I_2$, and the current difference ($I_{p\_i}-I_{n\_i}$) becomes a positive value. Accordingly, in a case where $w_i=+1$ and $x_i=+1$, the calculation unit 20 can calculate +1 as the value ($w_i \cdot x_i$) obtained by multiplying the i-th coefficient ($w_i$) by the i-th input value ($x_i$).

Figure 6:
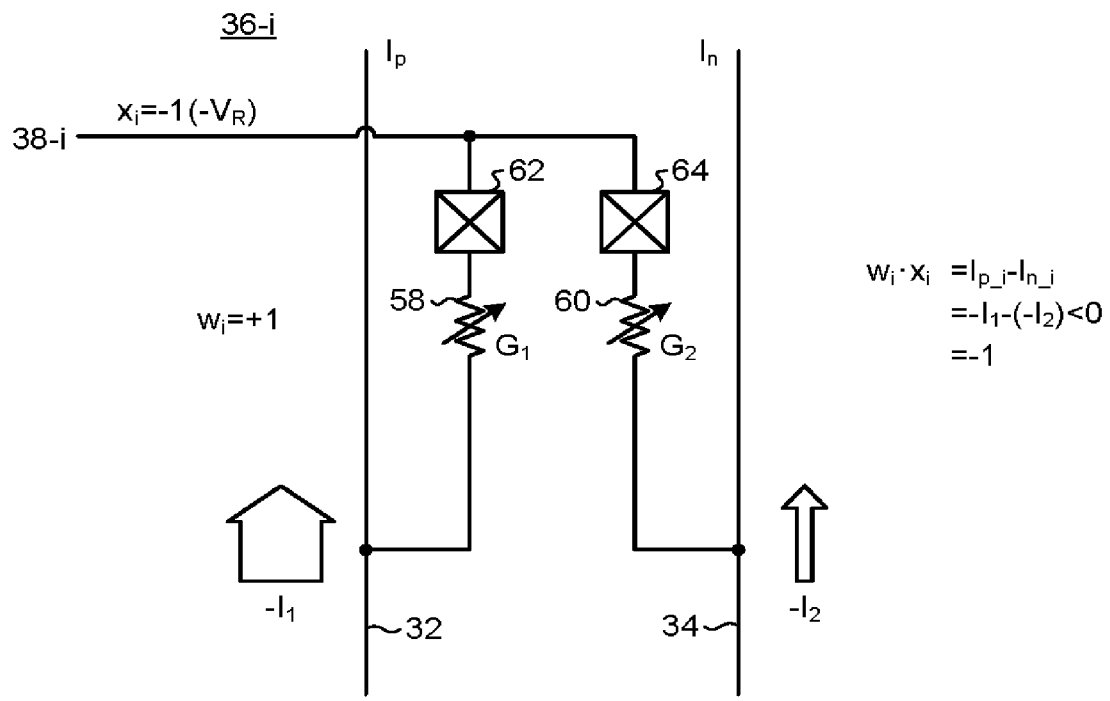
FIG. 6 is an explanatory diagram of an operation of a coefficient storage unit in a case where $w_i=+1$ and $x_i=-1$.

FIG. 6 is a diagram illustrating operations of the coefficient storage unit 36 in a case where $w_i=+1$ and $x_i=-1$. In a case where the i-th coefficient ($w_i$) is +1, the positive-side resistor 58 included in the i-th coefficient storage unit 36-$i$ is set to the first conductance ($G_1$). In a case where the i-th coefficient ($w_i$) is +1, the negative-side resistor 60 included in the i-th coefficient storage unit 36-$i$ is set to the second conductance ($G_2$).

In addition, in a case where the i-th input value ($x_i$) is −1, the application unit 38 applies a negative read voltage ($-V_R$) to the positive-side resistor 58 and the negative-side resistor 60. In such a case, a current having a negative first current value ($-I_1$) flows in the positive-side resistor 58. In addition, a current having a negative second current value ($-I_2$) flows in the negative-side resistor 60.

For this reason, in the example of FIG. 6, $I_{p\_i}=-I_1$, $I_{n\_i}=-I_2$, and the current difference ($I_{p\_i}-I_{n\_i}$) becomes a negative value. Therefore, in a case where $w_i=+1$ and $x_i=-1$, the calculation unit 20 calculates −1 as the value ($w_i \cdot x_i$) obtained by multiplying the i-th coefficient ($w_i$) by the i-th input value ($x_i$).

Figure 7:
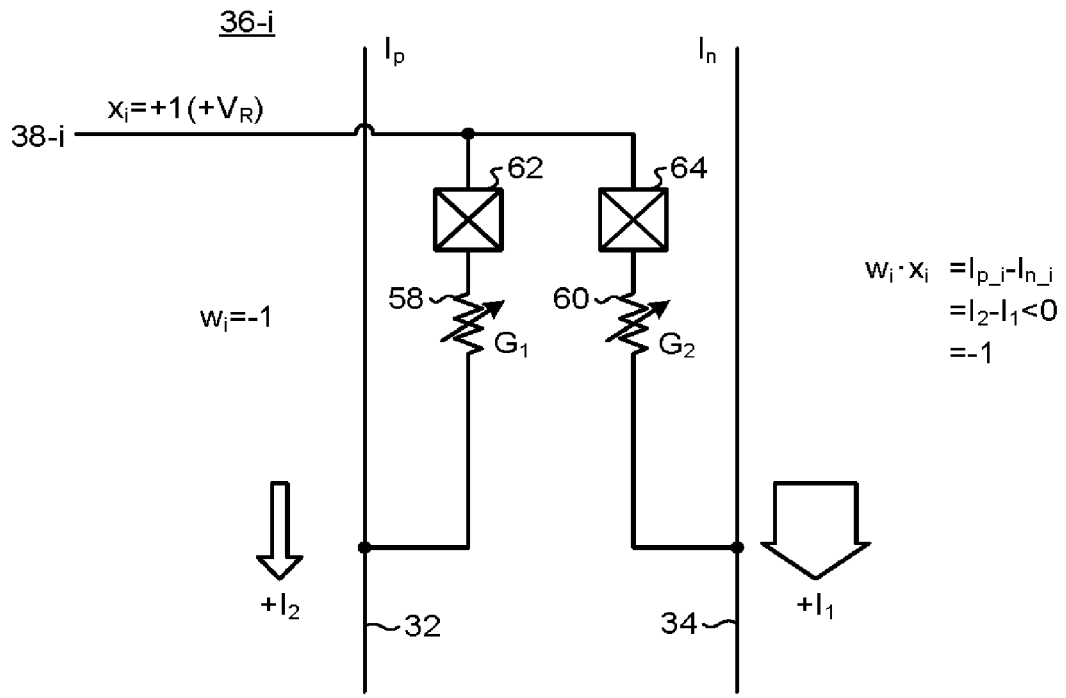
FIG. 7 is an explanatory diagram of an operation of a coefficient storage unit in a case where $w_i=-1$ and $x_i=+1$.

FIG. 7 is a diagram illustrating operations of the coefficient storage unit 36 in a case where $w_i=-1$ and $x_i=+1$. In a case where the i-th coefficient ($w_i$) is −1, the positive-side resistor 58 included in the i-th coefficient storage unit 36-$i$ is set to the second conductance ($G_2$). In a case where the i-th coefficient ($w_i$) is −1, the negative-side resistor 60 included in the i-th coefficient storage unit 36-$i$ is set to the first conductance ($G_1$).

In addition, in a case where the i-th input value ($x_i$) is +1, the application unit 38 applies a positive read voltage ($+V_R$) to the positive-side resistor 58 and the negative-side resistor 60. In such a case, a current having a positive second current value ($+I_2$) flows in the positive-side resistor 58. In addition, a current having a positive first current value ($+I_1$) flows in the negative-side resistor 60.

Therefore, in the example of FIG. 7, $I_{p\_i}=+I_2$, $I_{n\_i}=+I_1$, and the current difference ($I_{p\_i}-I_{n\_i}$) becomes a negative value. Therefore, in a case where $w_i=-1$ and $x_i=+1$, the calculation unit 20 calculates −1 as the value ($w_i \cdot x_i$) obtained by multiplying the i-th coefficient ($w_i$) by the i-th input value ($x_i$).

Figure 8:
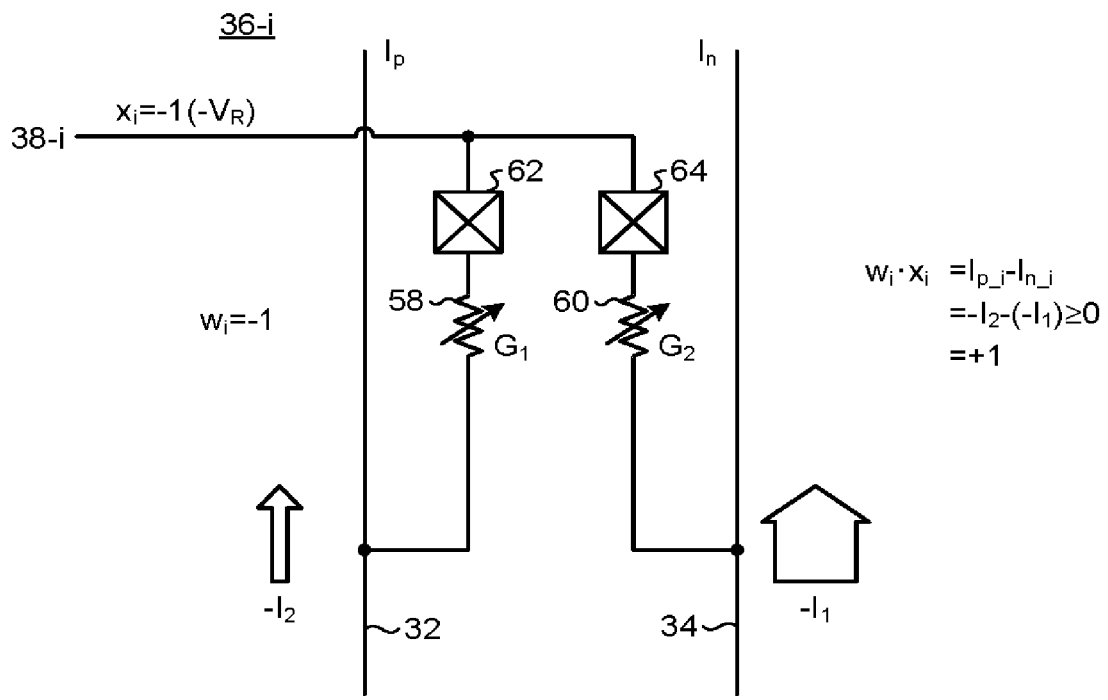
FIG. 8 is an explanatory diagram of an operation of a coefficient storage unit in a case where $w_i=-1$ and $x_i=-1$.

FIG. 8 is a diagram illustrating operations of the coefficient storage unit 36 in a case where $w_i=-1$ and $x_i=-1$. In a case where the i-th coefficient ($w_i$) is −1, the positive-side resistor 58 included in the i-th coefficient storage unit 36-$i$ is set to the second conductance ($G_2$). In a case where the i-th coefficient ($w_i$) is −1, the negative-side resistor 60 included in the i-th coefficient storage unit 36-$i$ is set to the first conductance ($G_1$).

In addition, in a case where the i-th input value ($x_i$) is −1, the application unit 38 applies a negative read voltage ($-V_R$) to the positive-side resistor 58 and the negative-side resistor 60. In such a case, a current having a negative second current value ($-I_2$) flows in the positive-side resistor 58. In addition, a current having a negative first current value ($-I_1$) flows in the negative-side resistor 60.

For this reason, in the example of FIG. 8, $I_{p\_i}=-I_2$, $I_{n\_i}=-I_1$, and the current difference ($I_{p\_i}-I_{n\_i}$) becomes a positive value. Therefore, in a case where $w_i=-1$ and $x_i=-1$, the calculation unit 20 calculates +1 as the value ($w_i \cdot x_i$) obtained by multiplying the i-th coefficient ($w_i$) by the i-th input value ($x_i$).

As described above, a difference value $\{(I_{p\_1}+I_{p\_2}+ \ldots +I_{p\_M})-(I_{n\_1}+I_{n\_2}+ \ldots +I_{n\_M})\}$ between the sum $(I_{p\_1}+I_{p\_2}+ \ldots +I_{p\_M})$ of the currents flowing in the M positive-side resistors 58 included in the M coefficient storage units 36 and the sum $(I_{n\_1}+I_{n\_2}+ \ldots +I_{n\_M})$ of the currents flowing in the M negative-side resistors 60 included in the M coefficient storage units 36 represents the product sum calculation (multiplication accumulation) result of the M input values and the M coefficients.

Figure 9:
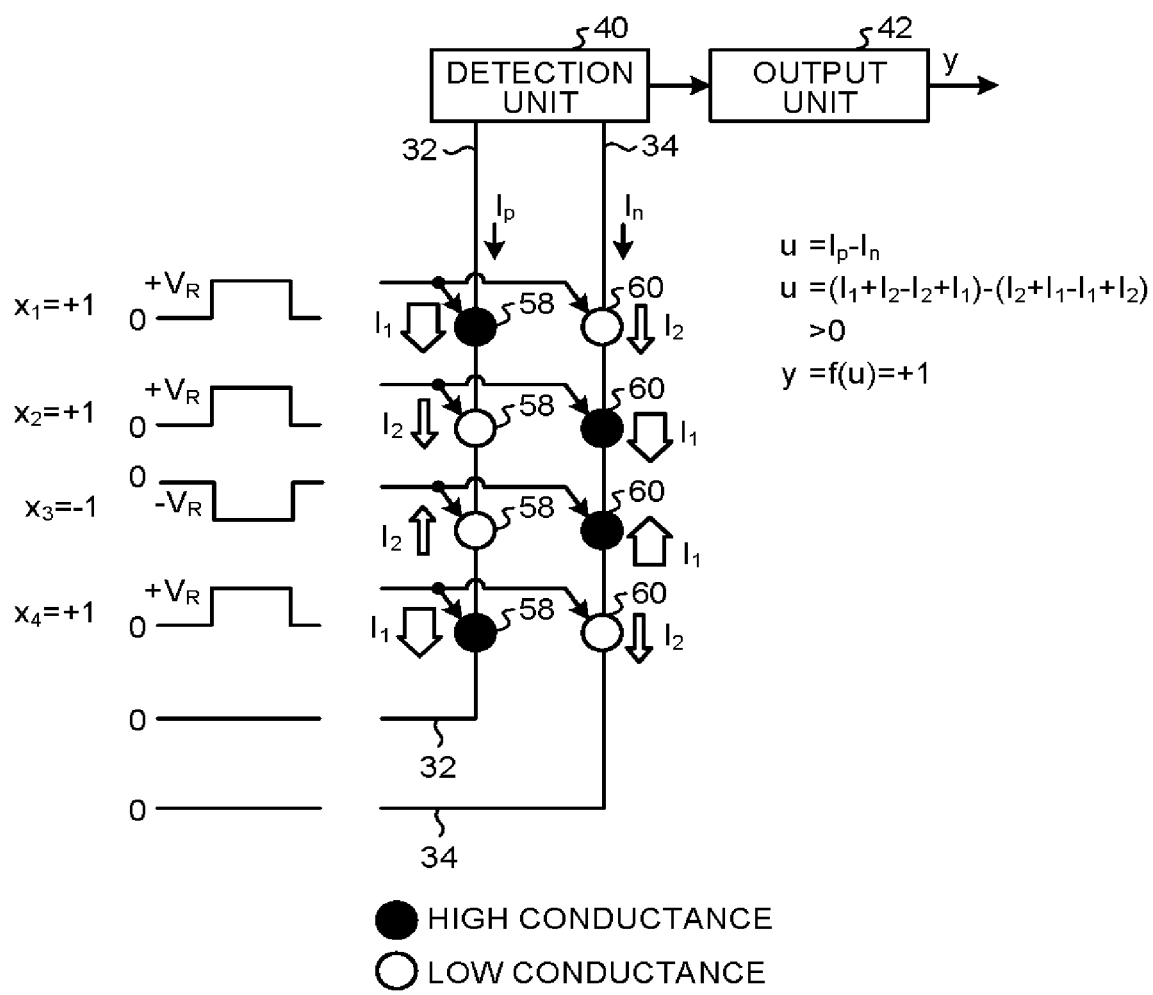
FIG. 9 is an explanatory diagram of an operation by a calculation unit in a calculation mode.

FIG. 9 is a diagram illustrating an operation by the calculation unit 20 in the calculation mode. In the calculation mode, in a case where the corresponding coefficient (x) is +1, a positive read voltage ($+V_R$) is applied to each of the M positive-side resistors 58 and in a case where the corresponding coefficient (x) is −1, a negative read voltage (−$V_R$) is applied to each of the M positive-side resistors 58. In addition, the sum of the positive-side currents (the currents flowing in the positive-side resistor 58 in this example) output from the M coefficient storage units 36 is output to the positive-side bit line 32.

In addition, in the calculation mode, in a case where the corresponding coefficient (x) is +1, a positive read voltage (+$V_R$) is applied to each of the M negative-side resistors 60, and in a case where the corresponding coefficient (x) is −1, a negative read voltage (−$V_R$) is applied to each of the M negative-side resistors 60. In addition, the sum of negative-side currents (currents flowing in the negative-side resistor 60 in this example) output from the M coefficient storage units 36 is output to the negative-side bit line 34.

In the calculation mode, the detection unit 40 compares the current ($I_p$) flowing in the positive-side bit line 32 with the current ($I_n$) flowing in the negative-side bit line 34. In a case where the current ($I_p$) flowing in the positive-side bit line 32 and the current ($I_n$) flowing in the negative-side bit line 34 are equal to each other, or in a case where the current ($I_p$) flowing in the positive-side bit line 32 is larger than the current ($I_n$) flowing in the negative-side bit line 34, the output unit 42 outputs an output value (y) of +1. In addition, in a case where the current ($I_p$) flowing in the positive-side bit line 32 and the current ($I_n$) flowing in the negative-side bit line 34 are not equal to each other and current ($I_n$) flowing in the negative-side bit line 34 is larger than the current ($I_p$) flowing in the positive-side bit line 32, the output unit 42 outputs an output value (y) of −1.

As described above, in the calculation mode, the calculation unit 20 can perform a product sum calculation of M input values as binary values and M coefficients as binary values and can output an output value expressed as a binary value as a result of the product sum calculation.

Figure 10:
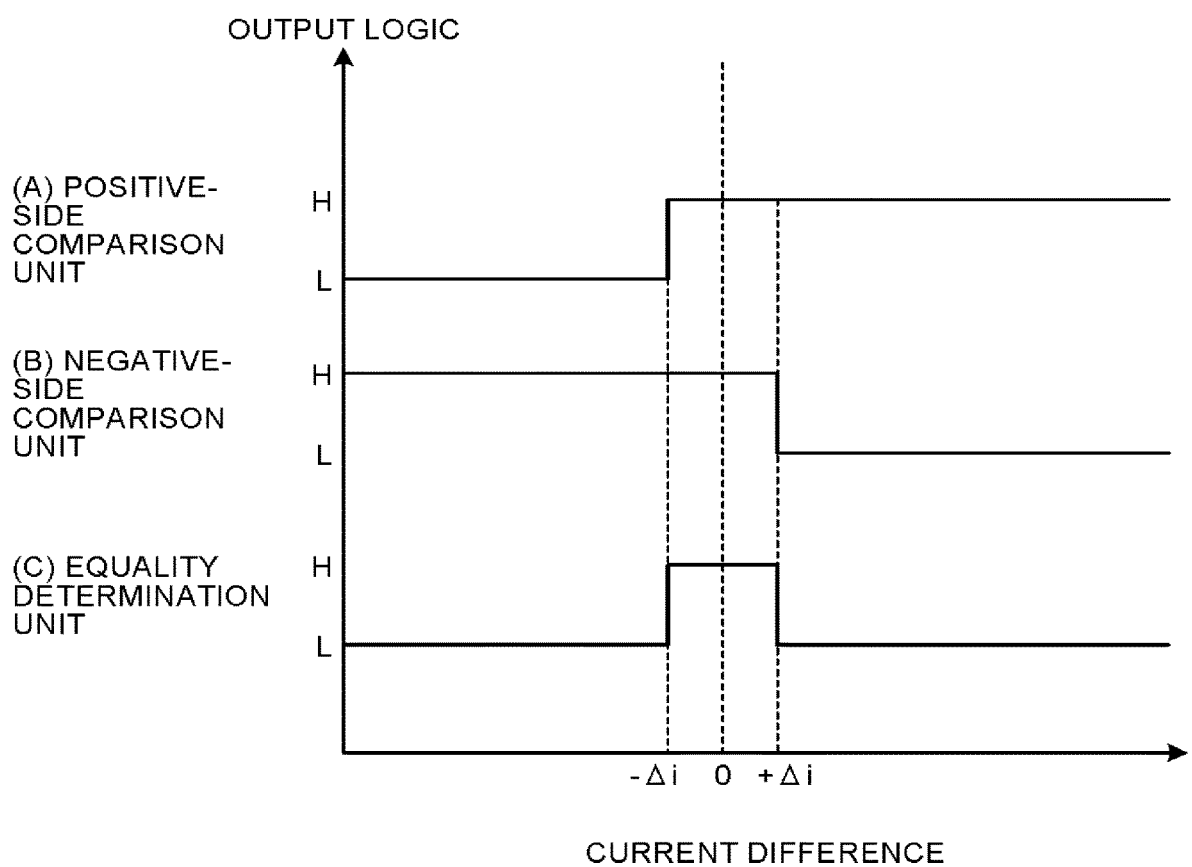
FIG. 10 is a diagram illustrating input-output characteristics of a positive-side comparison unit, a negative-side comparison unit, and an equality determination unit.

FIG. 10 is a diagram illustrating input-output characteristics of the positive-side comparison unit 72, the negative-side comparison unit 74, and the equality determination unit 76.

The positive-side comparison unit 72 determines whether or not the current flowing in the positive-side bit line 32 is larger than a current obtained by subtracting a predetermined offset (|Δi|) from the current flowing in the negative-side bit line 34. Accordingly, as illustrated in (A) of FIG. 10, in a case where the current difference obtained by subtracting the negative-side total current from the positive-side total current is equal to or smaller than the first threshold value (−Δi) obtained by subtracting the offset from 0, the positive-side comparison unit 72 outputs logic L, and in a case where the current difference is larger than the first threshold value (−Δi), the positive-side comparison unit 72 outputs logic H.

In addition, the negative-side comparison unit 74 determines whether or not the current flowing in the negative-side bit line 34 is larger than the current obtained by adding a predetermined offset to the current flowing in the positive-side bit line 32. Accordingly, as illustrated in (B) of FIG. 10, in a case where the current difference obtained by subtracting the negative-side total current from the positive-side total current is equal to or smaller than the second threshold value (+Δi) obtained by adding the offset to 0, the negative-side comparison unit 74 outputs logic H, and in a case where the current difference is larger than the second threshold value (+Δi), the negative-side comparison unit 74 outputs logic L.

In addition, in a case where the logic value output from the positive-side comparison unit 72 and the logic value output from the negative-side comparison unit 74 are equal to each other, the equality determination unit 76 outputs logic H, and in a case where the logic values are not equal to each other, the equality determination unit 76 outputs logic L. Accordingly, as illustrated in (C) of FIG. 10, in a case where the current difference between the positive-side total current and the negative-side total current falls within a range from the first threshold value (−Δi) to the second threshold value (+Δi), the equality determination unit 76 outputs logic H, and in the other case, the equality determination unit 76 outputs logic L.

Therefore, the detection unit 40 can determine whether or not the positive-side total current obtained by summing the currents flowing in the M positive-side resistors 58 and the negative-side total current obtained by summing the currents flowing in the M negative-side resistors 60 are equal to each other. In addition, the detection unit 40 can determine whether the positive-side total current is larger than the negative-side total current or the negative-side total current is larger than the positive-side total current.

In addition, in a case where the current difference obtained by subtracting the negative-side total current from the positive-side total current is equal to or smaller than the first threshold value (−Δi) obtained by subtracting the offset from 0, the positive-side comparison unit 72 may output logic H, and in a case where the current difference is larger than the first threshold value (−Δi), the positive-side comparison unit 72 may output logic L. In addition, in a case where the current difference obtained by subtracting the negative-side total current from the positive-side total current is equal to or smaller than the second threshold value (+Δi) obtained by adding the offset to 0, the negative-side comparison unit 74 outputs logic L, and in a case where the current difference is larger than the second threshold value (+Δi), the negative-side comparison unit 74 outputs logic H. Even in such a case, as illustrated in (C) of FIG. 10, in a case where the current difference between the positive-side total current and the negative-side total current falls within a range from the first threshold value (−Δi) to the second threshold value (+Δi), the equality determination unit 76 outputs logic H, and in the other case, the equality determination unit 76 outputs logic L.

Figure 11:
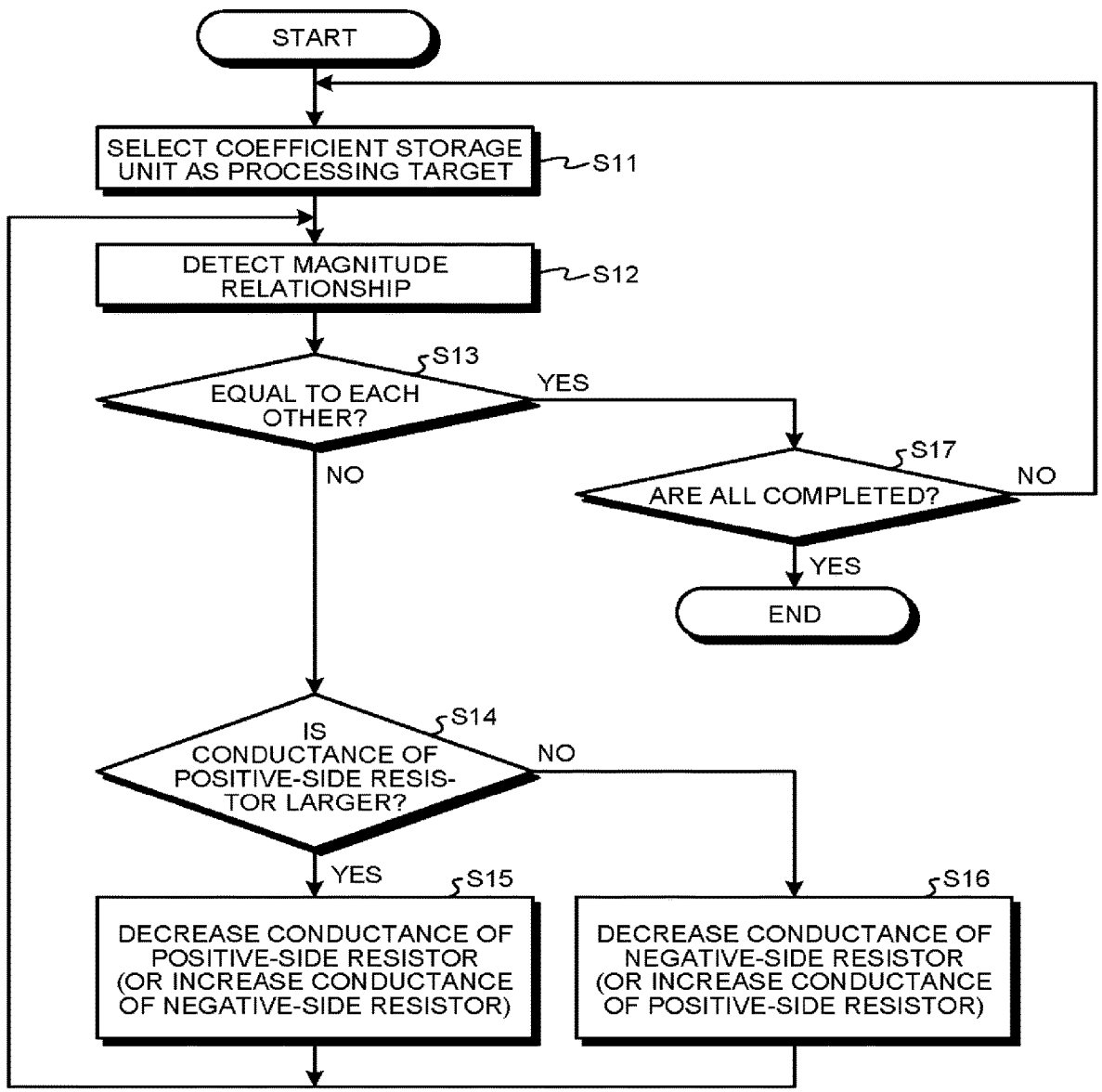
FIG. 11 is a process flow diagram of a calculation unit in an initialization mode.
Figure 12:
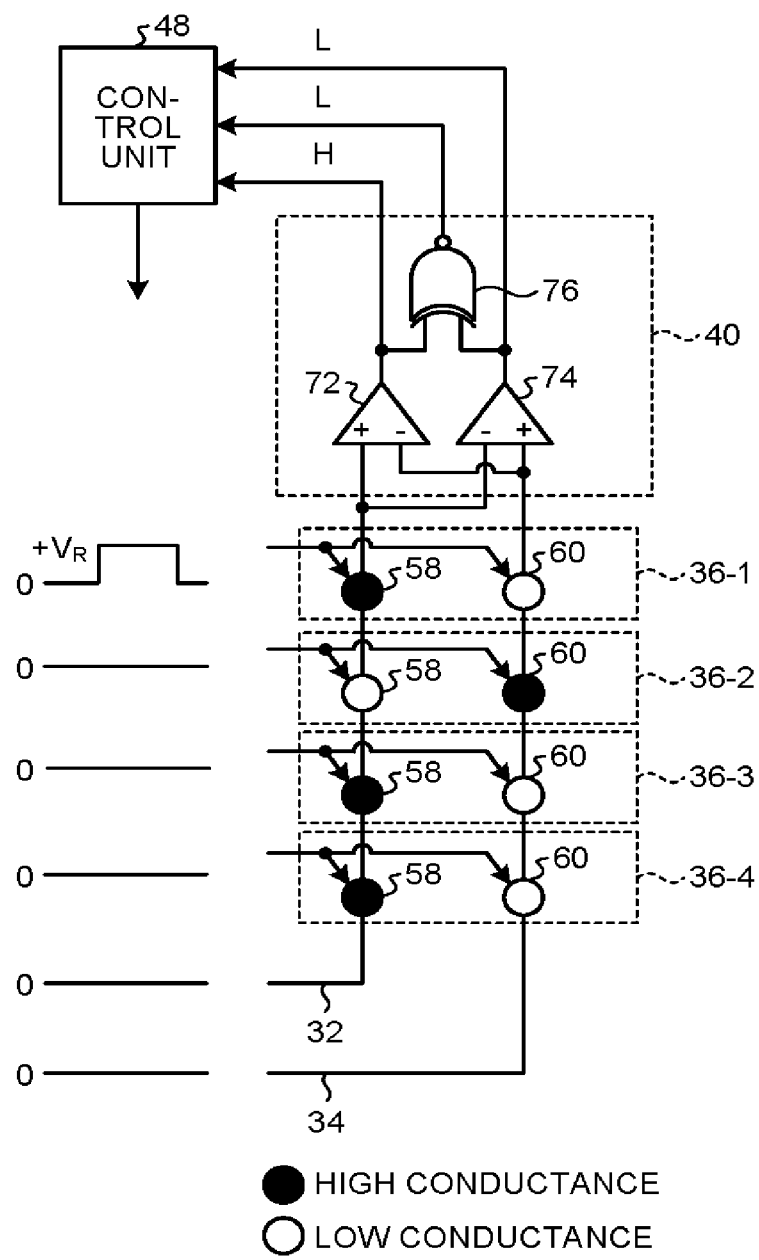
FIG. 12 is a diagram illustrating a detecting operation of a magnitude of conductance.
Figure 13:
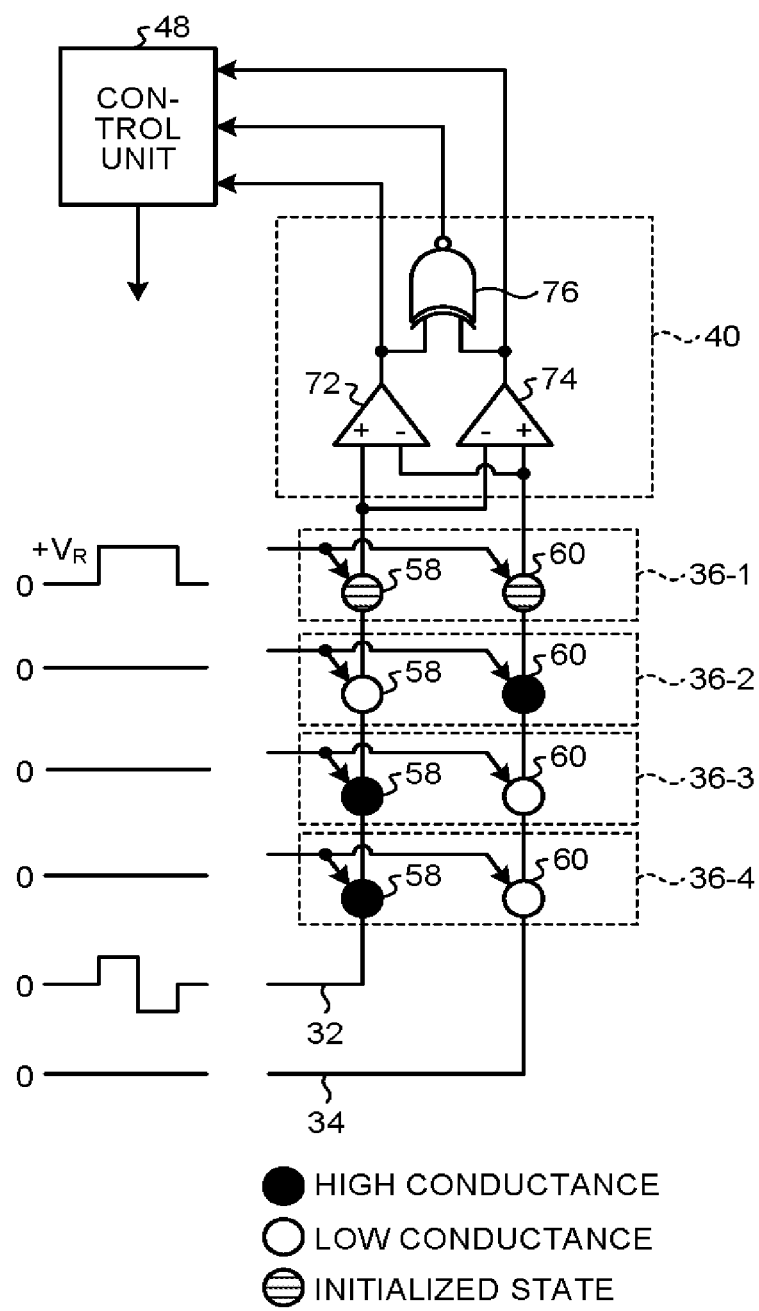
FIG. 13 is a diagram illustrating a write operation to a positive-side resistor at the time of initialization.
Figure 14:
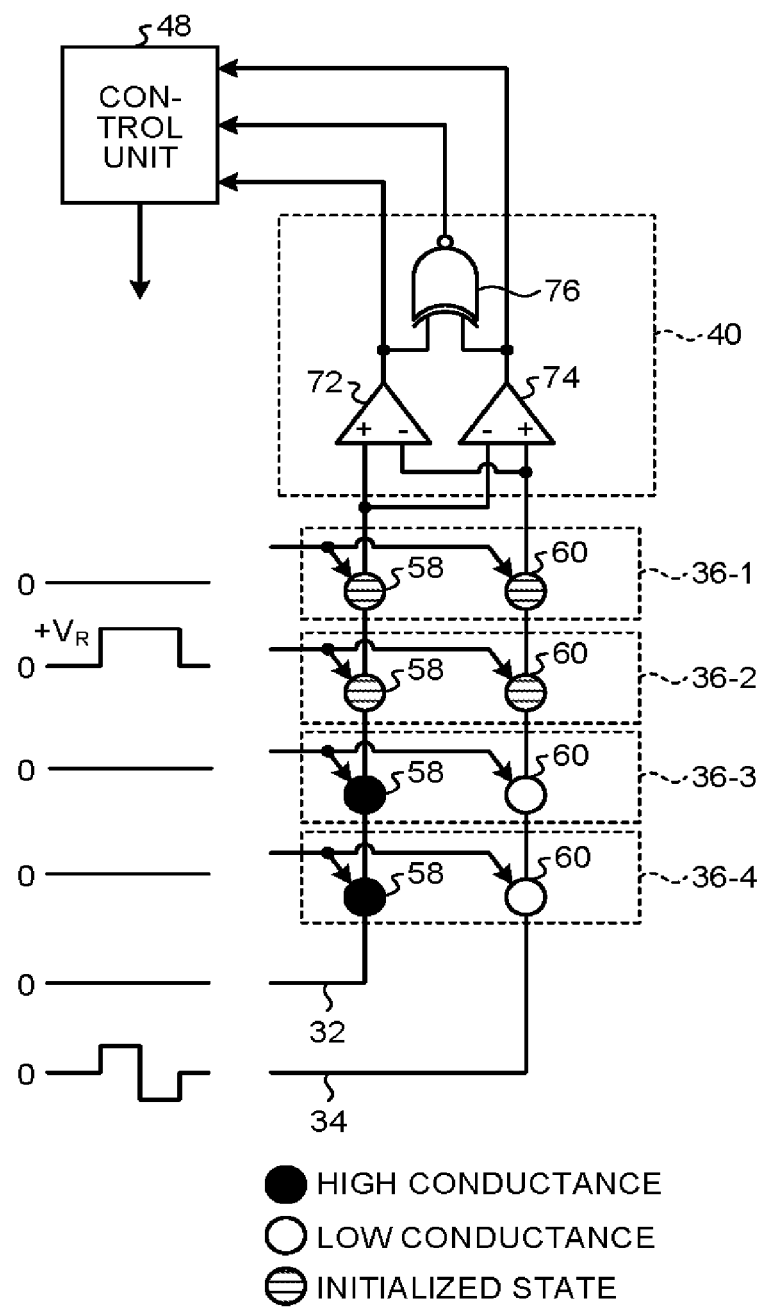
FIG. 14 is a diagram illustrating a write operation to a negative-side resistor at the time of initialization.
Figure 15:
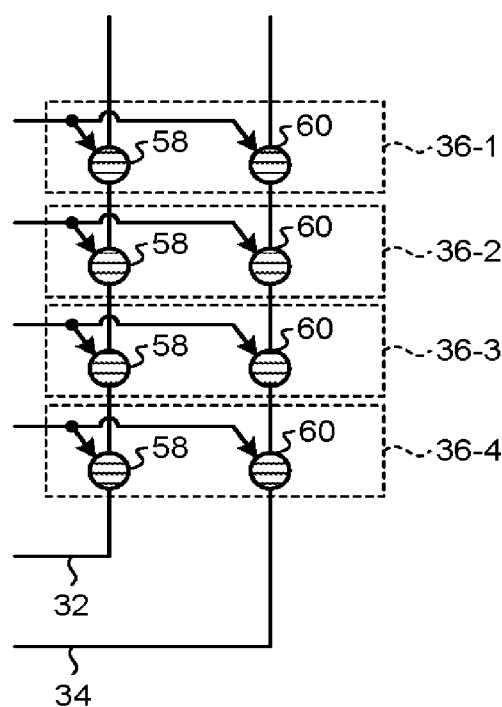
FIG. 15 is a diagram illustrating a state after initializing all M coefficient storage units.

FIG. 11 is a diagram illustrating a process flow of the calculation unit 20 in the initialization mode. In addition, FIGS. 12 to 15 are views to be referred to in the description of FIG. 11. FIG. 12 is a diagram illustrating a detecting operation of the magnitude of the conductance of the positive-side resistor 58 and the conductance of the negative-side resistor 60. FIG. 13 is a diagram illustrating a write operation to the positive-side resistor 58 at the time of initialization. FIG. 14 is a diagram illustrating a write operation to the negative-side resistor 60 at the time of initialization. FIG. 15 is a diagram illustrating a state after initializing all of the M coefficient storage units 36.

The calculation device 10 is transitioned to the initialization mode in the case of being instructed by a user or the like. In the initialization mode, the control unit 48 of the calculation unit 20 executes processes in the flow illustrated in FIG. 11.

First, in S11, the control unit 48 selects one coefficient storage unit 36 among the M coefficient storage units 36 as a processing target.

Subsequently, in S12, the control unit 48 detects whether the conductance of the positive-side resistor 58 and the conductance of the negative-side resistor 60 are equal to each other, whether the conductance of the positive-side resistor 58 is larger than the conductance of the negative-side resistor 60, or whether the conductance of the negative-side resistor 60 is larger than the conductance of the positive-side resistor 58 for the coefficient storage unit 36 as a processing target.

For example, in S12, as illustrated in FIG. 12, the control unit 48 applies a positive read voltage ($+V_R$) to the positive-side resistor 58 and the negative-side resistor 60 included in the coefficient storage unit 36 as a processing target. In a case where a positive read voltage ($+V_R$) is applied only to the positive-side resistor 58 and the negative-side resistor 60 included in the coefficient storage unit 36 as a processing target, the detection unit 40 can detect the magnitude relationship between the conductance of the positive-side resistor 58 and the conductance of the negative-side resistor 60 included in the coefficient storage unit 36 as a processing target. Then, the control unit 48 acquires the detection result by the detection unit 40.

Subsequently, in S13, on the basis of the detection result acquired from the detection unit 40, the control unit 48 determines whether or not the conductance of the positive-side resistor 58 and the conductance of the negative-side resistor 60 are equal to each other. For example, in a case where logic H is output from the equality determination unit 76, the control unit 48 determines that the conductance of the positive-side resistor 58 and the conductance of the negative-side resistor 60 are equal to each other.

In a case where the conductance of the positive-side resistor 58 and the conductance of the negative-side resistor 60 are not equal to each other (No in S13), the control unit 48 allows the process to proceed to S14. In S14, on the basis of the detection result acquired from the detection unit 40, the control unit 48 determines whether the conductance of the positive-side resistor 58 is larger than the conductance of the negative-side resistor 60 or the conductance of the negative-side resistor 60 is larger than the conductance of the positive-side resistor 58. For example, in a case where logic L is output from the equality determination unit 76 and logic H is output from the positive-side comparison unit 72, the control unit 48 determines that the conductance of the positive-side resistor 58 is larger than the conductance of the negative-side resistor 60. In addition, in a case where logic L is output from the equality determination unit 76 and logic H is output from the negative-side comparison unit 74, the control unit 48 determines that the conductance of the negative-side resistor 60 is larger than the conductance of the positive-side resistor 58.

In a case where the control unit 48 determines that the conductance of the positive-side resistor 58 is larger than the conductance of the negative-side resistor 60 (Yes in S14), the process proceeds to S15. In addition, in a case where the control unit 48 determines that the conductance of the negative-side resistor 60 is larger than the conductance of the positive-side resistor 58 (No in S14), the process proceeds to S16.

In S15, the control unit 48 decreases the conductance of the positive-side resistor 58 by a predetermined amount. Specifically, the control unit 48 changes the conductance of the positive-side resistor 58 by applying a write voltage equal to or higher than a predetermined threshold value, which is larger than the read voltage, to the positive-side resistor 58 included in the coefficient storage unit 36 as a processing target.

For example, as illustrated in FIG. 13, the control unit 48 allows the corresponding application unit 38 to generate a positive read voltage ($+V_R$) and at the same time allows the positive-side voltage generation unit 44 to generate a first voltage lower than the reference voltage (for example, a ground potential). Accordingly, the control unit 48 can apply the write voltage higher than the read voltage ($V_R$) to the positive-side resistor 58. In addition, during the time period when the read voltage ($V_R$) is being generated, the control unit 48 may allow the positive-side voltage generation unit 44 to first generate a voltage higher than the reference voltage for a predetermined time period and to subsequently generate the first voltage. Accordingly, the control unit 48 can change the conductance of the positive-side resistor 58 by a small amount at a time.

In the embodiment, in S15, the control unit 48 decreases the conductance of the positive-side resistor 58 by a predetermined amount. Alternatively, in S15, the control unit 48 may increase the conductance of the negative-side resistor 60 by a predetermined amount.

In S16, the control unit 48 decreases the conductance of the negative-side resistor 60 by a predetermined amount. Specifically, the control unit 48 changes the conductance of the negative-side resistor 60 by applying a write voltage higher than the read voltage to the negative-side resistor 60 included in the coefficient storage unit 36 as a processing target.

For example, as illustrated in FIG. 14, the control unit 48 allows the corresponding application unit 38 to generate a positive read voltage ($+V_R$) and, at the same time, allows the negative-side voltage generation unit 46 to generate a voltage lower than the reference voltage. Accordingly, the control unit 48 can apply the write voltage higher than the read voltage ($V_R$) to the negative-side resistor 60. During the time period when the read voltage ($V_R$) is being generated, the control unit 48 may allow the negative-side voltage generation unit 46 to first generate a voltage higher than the reference voltage for a predetermined time period and to subsequently generate a voltage lower than the reference voltage. Accordingly, the control unit 48 can change the conductance of the negative-side resistor 60 by a small amount at a time.

In addition, in the embodiment, in S16, the control unit 48 decreases the conductance of the negative-side resistor 60 by a predetermined amount. Alternatively, in S16, the control unit 48 may increase the conductance of the positive-side resistor 58 by a predetermined amount.

When S15 or S16 is completed, the control unit 48 returns the process to S12. Then, the control unit 48 repeats the processes from S12 to S16 until the conductance of the positive-side resistor 58 and the conductance of the negative-side resistor 60 are equal to each other to gradually decrease the conductance of the positive-side resistor 58 or the negative-side resistor 60.

In a case where the conductance of the positive-side resistor 58 and the conductance of the negative-side resistor 60 are equal to each other (Yes in S13), the control unit 48 allows the process to proceed to S17. In S17, the control unit 48 determines whether or not the conductance of the positive-side resistor 58 and the conductance of the negative-side resistor 60 are allowed to be equal to each other for all of the M coefficient storage units 36. In a case where there still remains a coefficient storage unit 36 in which the conductance of the positive-side resistor 58 and the conductance of the negative-side resistor 60 are not equal to each other (No in S17), the control unit 48 returns the process to S11 and repeats the process from S11.

For example, as illustrated in FIG. 15, the control unit 48 allows the conductance of the positive-side resistor 58 and the conductance of the negative-side resistor 60 to be equal to each other for all of the M coefficient storage units 36. Then, in a case where the control unit 48 allows the conductance of the positive-side resistor 58 and the conductance of the negative-side resistor 60 to be equal to each other for all of the M coefficient storage units 36 (Yes in S17), the flow ends.

Figure 16:
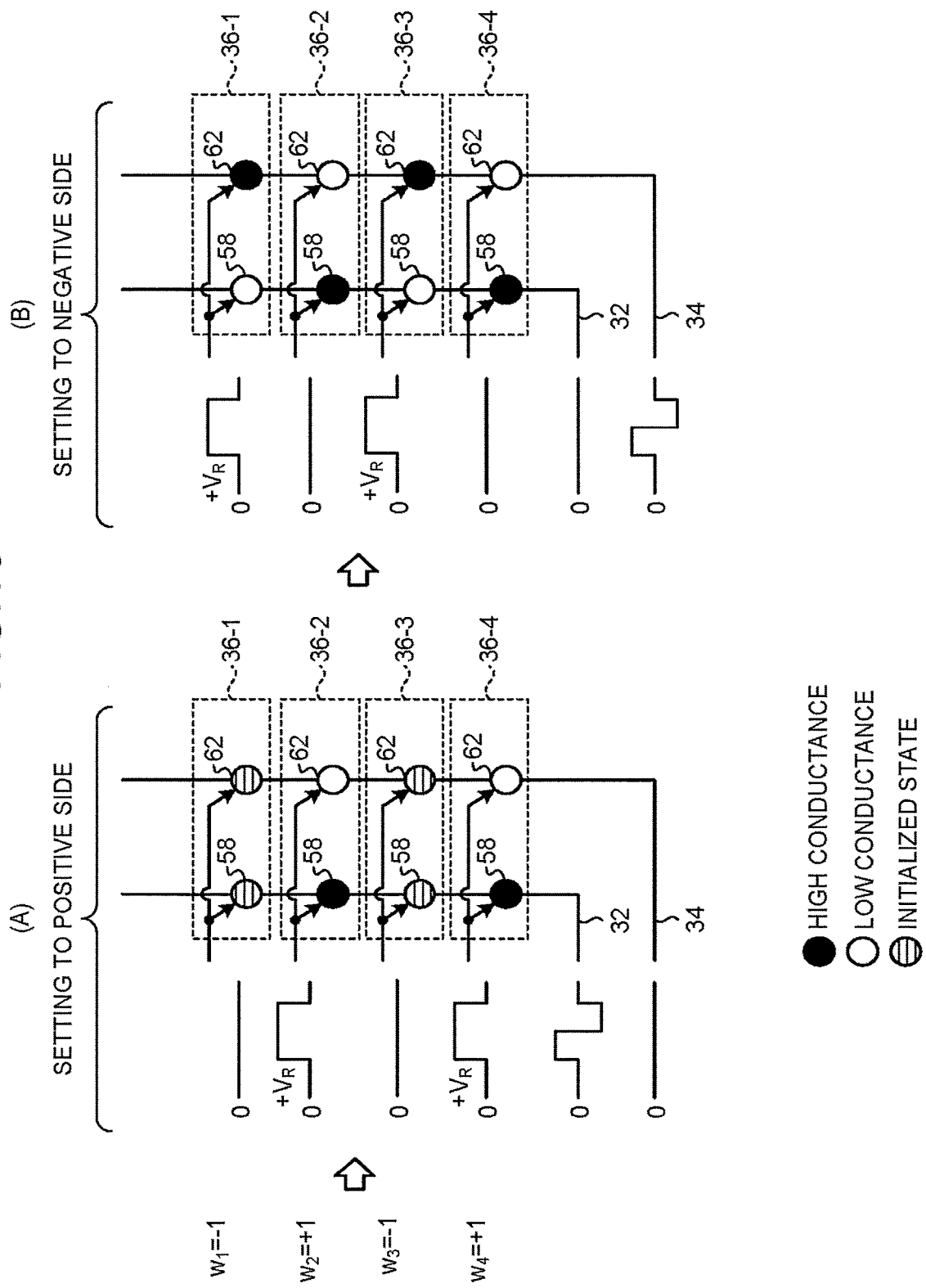
FIG. 16 is a diagram illustrating an operation by a calculation unit in a setting mode.

FIG. 16 is a diagram illustrating the operation by the calculation unit 20 in the setting mode. In the setting mode, the control unit 48 allows the coefficients to be stored in the coefficient storage unit 36 as an update target. In this case, the control unit 48 changes the conductance of one of the positive-side resistor 58 and the negative-side resistor 60 included in the coefficient storage unit 36 as the update target and does not change the conductance of the other thereof.

For example, in a case where the coefficient is +1, the control unit 48 increases the conductance of the positive-side resistor 58 included in the coefficient storage unit 36 as the update target and does not change the conductance of the negative-side resistor 60. Alternatively, in a case where the coefficient is +1, the control unit 48 may decrease the conductance of the negative-side resistor 60 included in the coefficient storage unit 36 as the update target and may not change the conductance of the positive-side resistor 58.

In addition, for example, in a case where the coefficient is −1, the control unit 48 increases the conductance of the negative-side resistor 60 included in the coefficient storage unit 36 as the update target and does not change the conductance of the positive-side resistor 58. Alternatively, in a case where the coefficient is −1, the control unit 48 may decrease the conductance of the positive-side resistor 58 included in the coefficient storage unit 36 as the update target and may not change the conductance of the negative-side resistor 60. Accordingly, the control unit 48 can set the conductances of the positive-side resistor 58 and the negative-side resistor 60 included in the coefficient storage unit 36 as the update target to a magnitude relationship according to the coefficient.

In addition, in the setting mode, the control unit 48 may acquire a plurality of coefficients and simultaneously store the plurality of coefficients in a plurality of the coefficient storage units 36 as the update targets.

In this case, as illustrated in (A) of FIG. 16, the control unit 48 allows one or a plurality of application units 38 corresponding to the coefficient of +1 to generate a positive read voltage (+$V_R$) and allows the other application unit 38 to generate a reference voltage (for example, a ground potential). At the same time, the control unit 48 allows the positive-side voltage generation unit 44 to generate a first voltage lower than the reference voltage and allows the negative-side voltage generation unit 46 to generate a reference voltage. Accordingly, the control unit 48 can increase the conductance of the positive-side resistor 58 included in one or a plurality of coefficient storage units 36 that store the coefficient of +1, so that the conductance of the negative-side resistor 60 can be allowed not to be changed.

Subsequently, as illustrated in (B) of FIG. 16, the control unit 48 allows one or a plurality of application units 38 corresponding to the coefficient of −1 to generate a positive read voltage (+$V_R$) and allows the other application unit 38 to generate a reference voltage. At the same time, the control unit 48 allows the negative-side voltage generation unit 46 to generate a first voltage lower than the reference voltage and allows the positive-side voltage generation unit 44 to generate a reference voltage. Accordingly, the control unit 48 can increase the conductance of the negative-side resistor 60 included in one or a plurality of coefficient storage units 36 that store the coefficient of −1, so that the conductance of the positive-side resistor 58 can be allowed not to be changed.

In addition, during the time period when the read voltage ($V_R$) is being generated, the control unit 48 may allow the positive-side voltage generation unit 44 or the negative-side voltage generation unit 46 to first generate a voltage higher than the reference voltage for a predetermined time period and to subsequently generate a voltage lower than the reference voltage. Accordingly, the control unit 48 can change the conductance of the positive-side resistor 58 or the negative-side resistor 60 by a small amount at a time.

The control unit 48 may perform a process of storing the coefficients in the coefficient storage unit 36 as the update target and, after that, may read out a difference between the conductance of the positive-side resistor 58 and the conductance of the negative-side resistor 60 set in the coefficient storage unit 36 as the update target. Subsequently, the control unit 48 verifies the difference between the read conductances. In a case where a correct difference between the conductances is not stored as a result of the verification, the control unit 48 further changes the conductance of the positive-side resistor 58 or the negative-side resistor 60 included in the coefficient storage unit 36 as the update target again. Accordingly, the control unit 48 can set the difference between the conductance of the positive-side resistor 58 and the conductance of the negative-side resistor 60 with high accuracy.

As described above, in the initialization mode, the calculation device 10 according to the embodiment allows the conductance of the positive-side resistor 58 and the conductance of the negative-side resistor 60 included in the M coefficient storage units 36 to be equal to each other. Then, in the setting mode, the calculation device 10 changes the conductance of one of the positive-side resistor 58 and the negative-side resistor 60 according to the value of the stored coefficient and does not change the conductance of the other. Accordingly, since the calculation device 10 according to the embodiment can set the coefficient by changing the conductance of one of the positive-side resistor 58 and the negative-side resistor 60, it is possible to set the coefficient with high accuracy with a simple process.

In addition, the control unit 48 may periodically execute the initialization mode. In this case, if the conductance of one of the positive-side resistor 58 and the negative-side resistor 60 is allowed to be decreased in the setting mode, the control unit 48 increases the conductance of the resistor with the decreased conductance in the setting mode in the initialization mode to allow the conductance of the positive-side resistor 58 and the conductance of the negative-side resistor 60 to be equal to each other. Alternatively, if the conductance of one of the positive-side resistor 58 and the negative-side resistor 60 is allowed to be increased in the setting mode, the control unit 48 allows the conductance of the resistor with the increased conductance in the setting mode to be decreased in the initialization mode to allow the conductance of the positive-side resistor 58 and the conductance of the negative-side resistor 60 to be equal to each other. Accordingly, even in a case where the initialization mode and the setting mode are repeated, the control unit 48 can prevent the conductance of the positive-side resistor 58 and the conductance of the negative-side resistor 60 from deviating from the conductance at time of the factory setting.

Modified Example

Next, a calculation device 10 according to Modified Example will be described. Since the calculation device 10 according to Modified Example has substantially the same functions and configurations as those of the calculation device 10 described with reference to FIGS. 1 to 16, blocks having substantially the same functions are denoted by the same reference numerals, and detailed description is omitted except for different points. This also applies to Modified Example 2.

Figure 17:
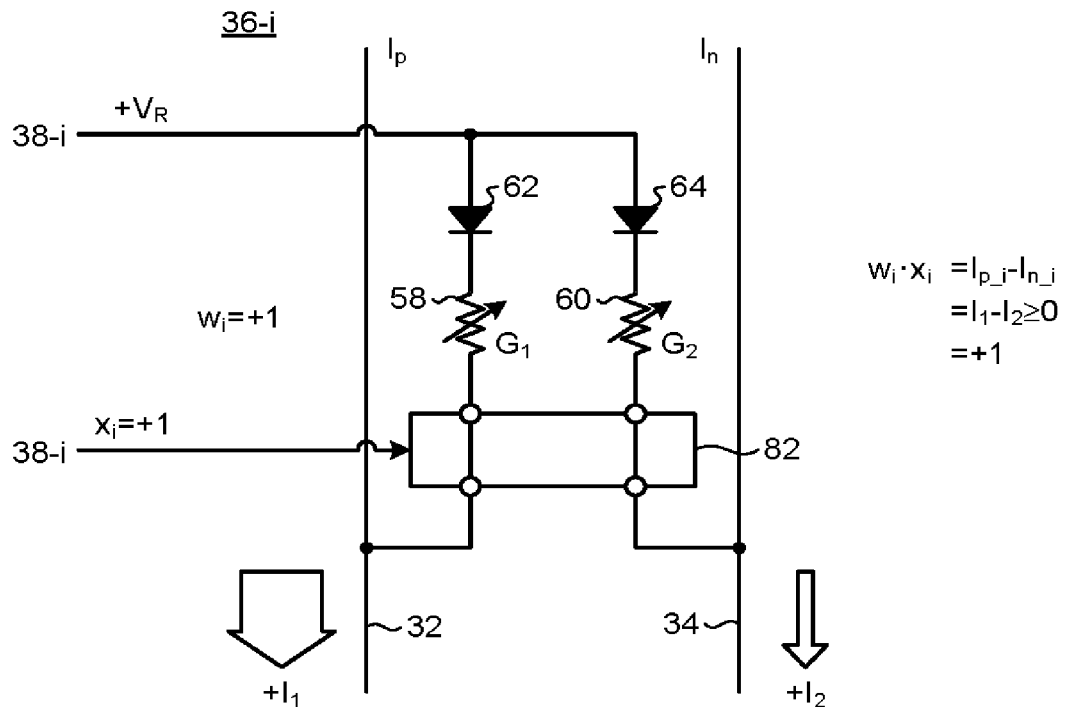
FIG. 17 is an explanatory diagram of an operation of a coefficient storage unit according to Modified Example in a case where $w_i=+1$ and $x_i=+1$.

FIG. 17 is a diagram illustrating operations of a coefficient storage unit 36 according to Modified Example in a case where $w_i=+1$ and $x_i=+1$.

Each of M coefficient storage units 36 according to Modified Example further includes a switching unit 82. The switching unit 82 switches between a straight connection state and a cross connection state under an external control.

In the case of the straight connection state, the switching unit 82 connects one end of the positive-side resistor 58 to the positive-side bit line 32 and connects one end of the negative-side resistor 60 to the negative-side bit line 34. Accordingly, in the straight connection state, the switching unit 82 can output the current flowing in the positive-side resistor 58 as a positive-side current to the positive-side bit line 32 and can output the current flowing in the negative-side resistor 60 as a negative-side current to the negative-side bit line 34.

In the case of the cross connection state, the switching unit 82 connects one end of the positive-side resistor 58 to the negative-side bit line 34 and connects one end of the negative-side resistor 60 to the positive-side bit line 32. Accordingly, in the cross connection state, the switching unit 82 can output the current flowing in the negative-side resistor 60 as a positive-side current to the positive-side bit line 32 and can output the current flowing in the positive-side resistor 58 as a negative-side current to the negative-side bit line 34.

In addition, in Modified Example, in the calculation mode, each of the M application units 38 applies a positive read voltage ($V_R$) to the positive-side resistor 58 and the negative-side resistor 60 included in the corresponding coefficient storage unit 36. In addition, in Modified Example, the positive-side rectification unit 62 prevents a reverse current from flowing in the positive-side resistor 58. In addition, in Modified Example, the negative-side rectification unit 64 prevents a reverse current from flowing in the negative-side resistor 60.

In Modified Example, each of the M application units 38 switches whether to allow the switching unit 82 included in the corresponding coefficient storage unit 36 to be in a straight connection or in a cross connection according to the corresponding input value.

For example, as illustrated in FIG. 17, in a case where the i-th coefficient ($w_i$) is +1, the positive-side resistor 58 included in the i-th coefficient storage unit 36-$i$ is set to the first conductance ($G_1=1/R_1$). In a case where the i-th coefficient ($w_i$) is +1, the negative-side resistor 60 included in the i-th coefficient storage unit 36-$i$ is set to the second conductance ($G_2=1/R_2$).

In this case, a current having a positive first current value ($+I_1$) flows in the positive-side resistor 58. In addition, a current having a positive second current value ($+I_2$) flows in the negative-side resistor 60. In addition, it is assumed that $G_1 > G_2$. Therefore, $|I_1|>|I_2|$ In a case where the i-th input value ($x_i$) is +1, the application unit 38 allows the switching unit 82 to be in a straight connection. Therefore, the current flowing in the positive-side resistor 58 is output to the positive-side bit line 32. In addition, the current flowing in the negative-side resistor 60 is output to the negative-side bit line 34.

Herein, the calculation result of the value ($w_i \cdot x_i$) obtained by multiplying the i-th coefficient ($w_i$) by the i-th input value ($x_i$) is represented by the current difference ($I_{p\_i}-I_{n\_i}$) between the current ($I_{p\_i}$) output from the i-th coefficient storage unit 36-$i$ to the positive-side bit line 32 and the current ($I_{n\_i}$) output from the i-th coefficient storage unit 36-$i$ to the negative-side bit line 34.

For this reason, in the example of FIG. 17, $I_{p\_i}=+I_1$, $I_{n\_i}=+I_2$, and the current difference ($I_{p\_i}-I_{n\_i}$) becomes a positive value. Accordingly, in a case where $w_i=+1$ and $x_i=+1$, the calculation unit 20 according to Modified Example can calculate +1 as the value ($w_i \cdot x_i$) obtained by multiplying the i-th coefficient ($w_i$) by the i-th input value ($x_i$).

Figure 18:
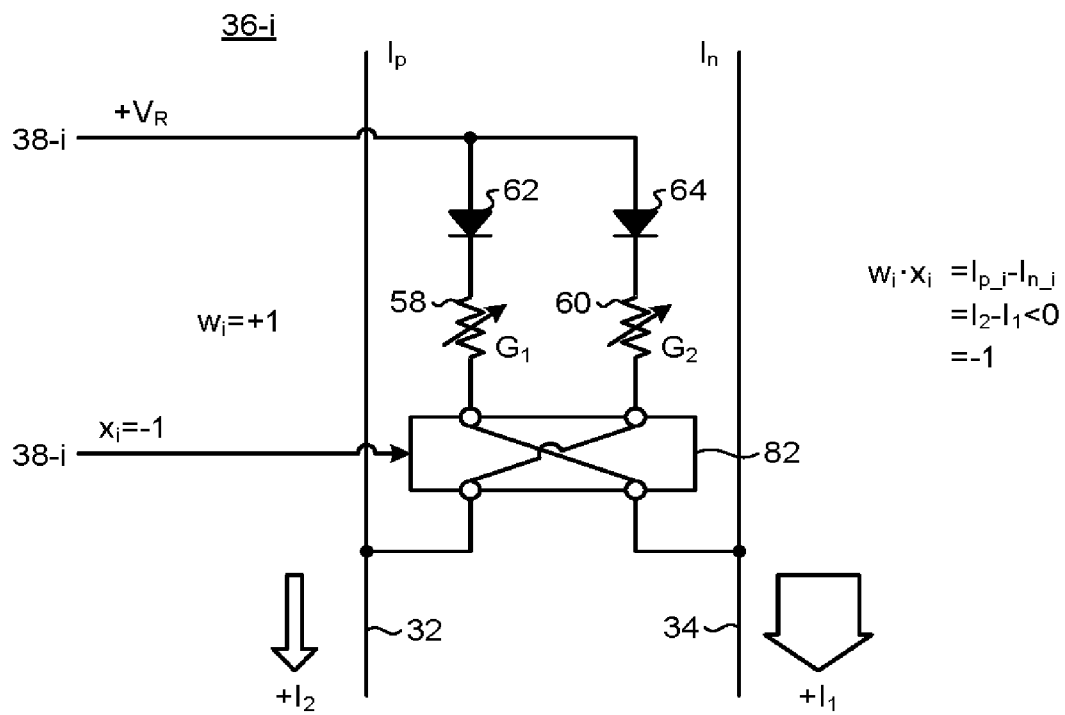
FIG. 18 is an explanatory diagram of an operation of a coefficient storage unit according to Modified Example in a case where $w_i=+1$ and $x_i=-1$.

FIG. 18 is a diagram illustrating the operation of the coefficient storage unit 36 according to Modified Example in a case where $w_i=+1$ and $x_i=-1$. In a case where the i-th coefficient ($w_i$) is +1, the positive-side resistor 58 included in the i-th coefficient storage unit 36-$i$ is set to the first conductance ($G_1$). In a case where the i-th coefficient ($w_i$) is +1, the negative-side resistor 60 included in the i-th coefficient storage unit 36-$i$ is set to the second conductance ($G_2$).

In a case where the i-th input value ($x_i$) is −1, the application unit 38 cross-connects the switching unit 82. Therefore, the current flowing in the positive-side resistor 58 is output to the negative-side bit line 34. In addition, the current flowing in the negative-side resistor 60 is output to the positive-side bit line 32.

For this reason, in the example of FIG. 18, $I_{p\_i}=I_2$, $I_{n\_i}=I_1$, and the current difference ($I_{p\_i}-I_{n\_i}$) becomes a negative value. Therefore, in a case where $w_i=+1$ and $x_i=-1$, the calculation unit 20 according to Modified Example can calculate −1 as the value ($w_i \cdot x_i$) obtained by multiplying the i-th coefficient ($w_i$) by the i-th input value ($x_i$).

Figure 19:
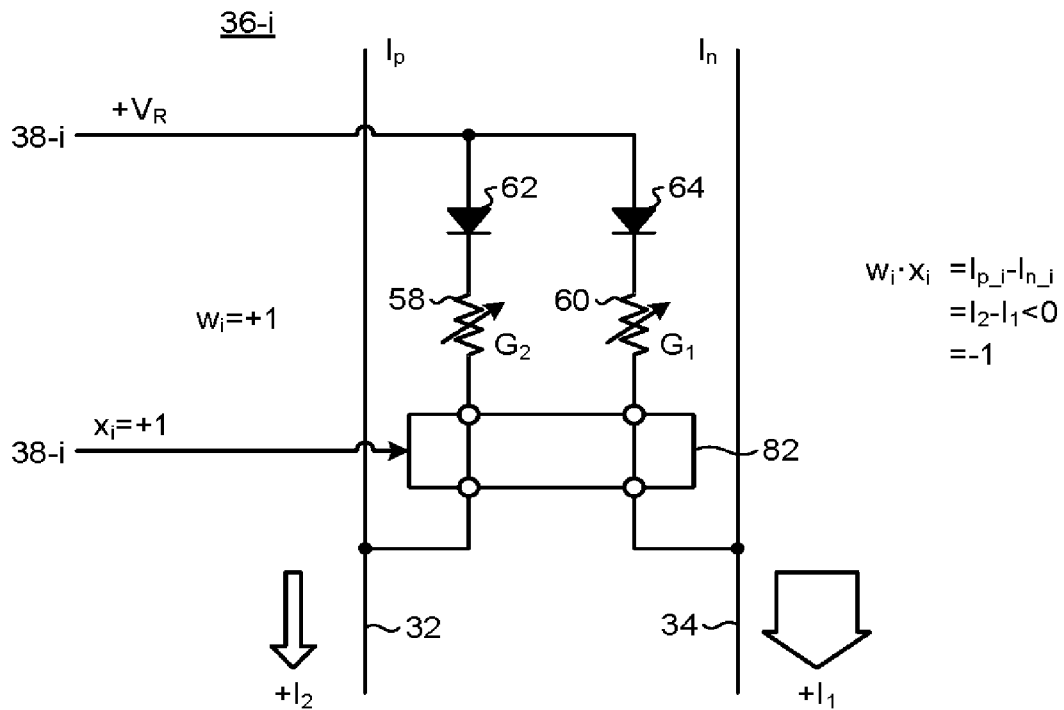
FIG. 19 is an explanatory diagram of an operation of a coefficient storage unit according to Modified Example in a case where $w_i=-1$ and $x_i=+1$.

FIG. 19 is a diagram illustrating operations of the coefficient storage unit 36 according to Modified Example in a case where $w_i=-1$ and $x_i=+1$. In a case where the i-th coefficient ($w_i$) is −1, the positive-side resistor 58 included in the i-th coefficient storage unit 36-$i$ is set to the second conductance ($G_2$). In a case where the i-th coefficient ($w_i$) is −1, the negative-side resistor 60 included in the i-th coefficient storage unit 36-$i$ is set to the first conductance ($G_1$).

In this case, a current having a positive second current value ($+I_2$) flows in the positive-side resistor 58. In addition, a current having a positive first current value ($+I_1$) flows in the negative-side resistor 60.

In a case where the i-th input value ($x_i$) is +1, the application unit 38 allows the switching unit 82 to be in a straight connection. Therefore, the current flowing in the positive-side resistor 58 is output to the positive-side bit line 32. In addition, the current flowing in the negative-side resistor 60 is output to the negative-side bit line 34.

For this reason, in the example of FIG. 19, $I_{p\_i}=+I_2$, $I_{n\_i}=+I_1$, and the current difference ($I_{p\_i}-I_{n\_i}$) is becomes a negative value. Therefore, in a case where $w_i=-1$ and $x_i=+1$, the calculation unit 20 according to Modified Example can calculate −1 as the value ($w_i \cdot x_i$) obtained by multiplying the i-th coefficient ($w_i$) by the i-th input value ($x_i$).

Figure 20:
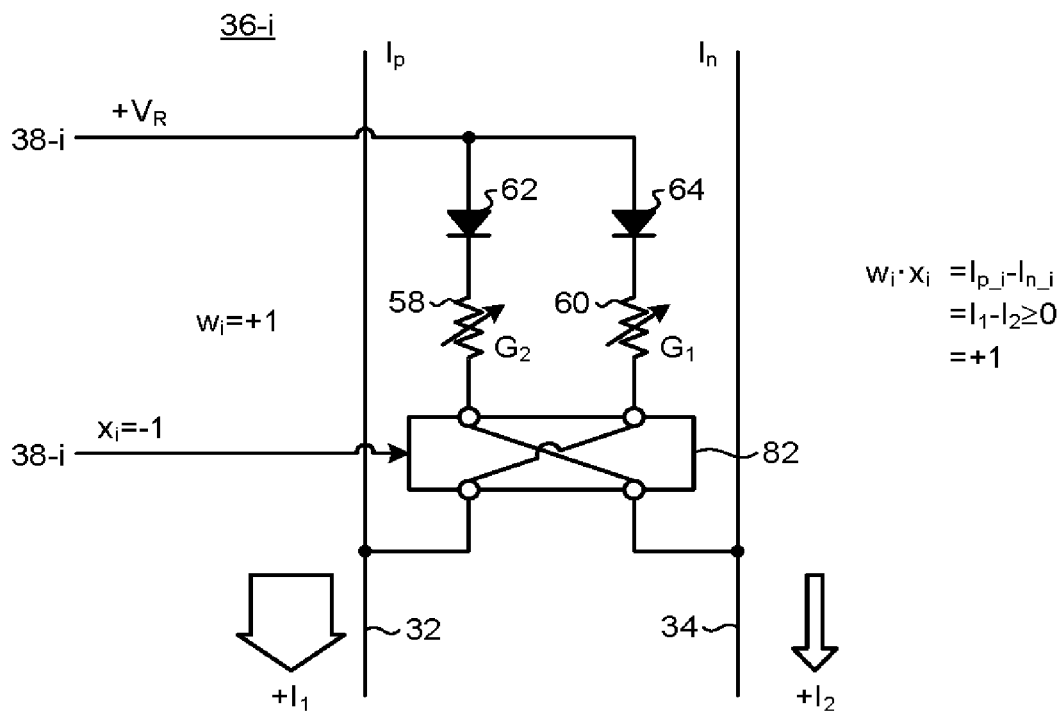
FIG. 20 is an explanatory diagram of an operation of a coefficient storage unit according to Modified Example in a case where $w_i=-1$ and $x_i=-1$.

FIG. 20 is a diagram illustrating operations of the coefficient storage unit 36 according to Modified Example in a case where $w_i=-1$ and $x_i=-1$. In a case where the i-th coefficient ($w_i$) is −1, the positive-side resistor 58 included in the i-th coefficient storage unit 36-$i$ is set to the second conductance ($G_2$). In a case where the i-th coefficient ($w_i$) is −1, the negative-side resistor 60 included in the i-th coefficient storage unit 36-$i$ is set to the first conductance ($G_1$).

In a case where the i-th input value ($x_i$) is −1, the application unit 38 cross-connects the switching unit 82. Therefore, the current flowing in the positive-side resistor 58 is output to the negative-side bit line 34. In addition, the current flowing in the negative-side resistor 60 is output to the positive-side bit line 32.

For this reason, in the example of FIG. 20, $I_{p\_i}=-I_2$, $I_{n\_i}=-I_1$, and the current difference ($I_{p\_i}-I_{n\_i}$) becomes a positive value. Therefore, in a case where $w_i=-1$ and $x_i=-1$, the calculation unit 20 according to Modified Example can calculate +1 as the value ($w_i \cdot x_i$) obtained by multiplying the i-th coefficient ($w_i$) by the i-th input value ($x_i$).

As described above, a difference value $\{(I_{p\_1}+I_{p\_2}+\ldots+I_{p\_M})-(I_{n\_1}+I_{n\_2}+\ldots+I_{n\_M})\}$ between the sum ($I_{p\_1}+I_{p\_2}+\ldots+I_{p\_M}$) of the currents flowing in the M positive-side resistors 58 included in the M coefficient storage units 36 and the sum ($I_{n\_1}+I_{n\_2}+\ldots+I_{n\_M}$) of the currents flowing in the M negative-side resistors 60 included in the M coefficient storage units 36 represents the product sum calculation (multiplication accumulation) result of the M input values and the M coefficients.

As described above, in Modified Example, each of the M application units 38 applies the read voltage to the positive-side resistor 58 and the negative-side resistor 60 and switches outputting the current flowing in the positive-side resistor 58 as a positive-side current and the current flowing in the negative-side resistor 60 as a negative-side current or outputting the current flowing in the negative-side resistor 60 as a positive-side current and the current flowing in the positive-side resistor 58 as a negative-side current according to the corresponding input value. Even in this case, each of the M application units 38 can change the magnitude relationship between the positive-side current and the negative-side current output from the corresponding coefficient storage unit 36 by the multiplication result of the corresponding input value and the corresponding coefficient.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A calculation device performing a product sum calculation of M input values (M is an integer of 2 or more) and M coefficients corresponding to the M input values on a one-to-one basis, comprising:
    M coefficient storage units provided corresponding to the M coefficients, each of the M coefficient storage units including a positive-side coefficient and a negative-side coefficient, a corresponding coefficient being represented a sign of a difference between the positive-side coefficient and the negative-side coefficient;
    M multiplication units provided corresponding to the M input values, each of the M multiplication units being configured to calculate a positive-side multiplication value obtained by multiplying the positive-side coefficient included in the corresponding coefficient storage unit by a sign inverted according to the corresponding input value and a negative-side multiplication value obtained by multiplying the negative-side coefficient included in the corresponding coefficient storage unit by a sign inverted according to the corresponding input value; and
    an output unit configured to output an output value according to a difference between a positive-side product sum calculation value obtained by summing the M positive-side multiplication values and a negative-side product sum calculation value obtained by summing the M negative-side multiplication values.

2. The calculation device according to claim 1, further comprising
    a control unit,
    wherein, the control unit is configured to
    in an initialization mode, allow the positive-side coefficient and the negative-side coefficient included in each of the M coefficient storage units to be equal to each other, and
    in a setting mode, set a magnitude relationship between the positive-side coefficient and the negative-side coefficient included in the coefficient storage unit as a setting target among the M coefficient storage units according to the corresponding coefficient.

3. The calculation device according to claim 1,
    wherein the M input values, the M coefficients, and the output value are binary values.

4. A calculation device performing a product sum calculation of M input values (M is an integer of 2 or more) and M coefficients corresponding to the M input values on a one-to-one basis, comprising:
    M coefficient storage units provided corresponding to the M coefficients, each of the M coefficient storage units including a positive-side resistor and a negative-side resistor, a corresponding coefficient being represented a sign of a difference in conductance between the positive-side resistor and the negative-side resistor;
    M application units provided corresponding to the M input values, the M application units being configured to change a magnitude relationship between a positive-side current and a negative-side current output from the corresponding coefficient storage unit according to a multiplication result of the corresponding input value and the corresponding coefficient by applying a voltage according to the corresponding input value to the positive-side resistor and the negative-side resistor included in the corresponding coefficient storage unit; and
    an output unit configured to output an output value according to a difference between the positive-side total current obtained by summing the positive-side currents output from the M coefficient storage units and the negative-side total current obtained by summing the negative-side currents output from the M coefficient storage units.

5. The calculation device according to claim 4, further comprising
    a control unit,
    wherein, the control unit is configured to
    in an initialization mode, allow the conductance of the positive-side resistor and the conductance of the negative-side resistor included in each of the M coefficient storage units to be equal to each other, and
    in a setting mode, set a magnitude relationship between the conductance of the positive-side resistor and the conductance of the negative-side resistor included in the coefficient storage unit as a setting target among the M coefficient storage units according to the corresponding coefficient.

6. The calculation device according to claim 5,
wherein each of the M application units applies a voltage with polarity being inverted according to the corresponding input value to the positive-side resistor and the negative-side resistor included in the corresponding coefficient storage unit and allows a current flowing in the positive-side resistor to be output as the positive-side current and allows a current flowing in the negative-side resistor to be output as the negative-side current.

7. The calculation device according to claim 5,
wherein each of the M application units applies a predetermined voltage to the positive-side resistor and the negative-side resistor and switches outputting a current flowing in the positive-side resistor as the positive-side current and a current flowing in the negative-side resistor as the negative-side current or outputting a current flowing in the negative-side resistor as the positive-side current and the current flowing in the positive-side resistor as the negative-side current according to the corresponding input value.

8. The calculation device according to claim 5,
wherein in the setting mode, the control unit changes the conductance of one of the positive-side resistor and the negative-side resistor included in the coefficient storage unit as a setting target.

9. The calculation device according to claim 5,
wherein in the setting mode, the control unit sets an absolute value of a difference between the conductance of the positive-side resistor and the conductance of the negative-side resistor included in the coefficient storage unit as a setting target to a predetermined value.

10. The calculation device according to claim 5,
wherein, in the initialization mode, for each of the M coefficient storage units, the control unit is configured to detect a difference between a current flowing by applying a predetermined voltage to the positive-side resistor and a current flowing by applying the predetermined voltage to the negative-side resistor, and change the conductance of any one of the positive-side resistor and the negative-side resistor so that an absolute value of the detected difference is equal to or smaller than a predetermined value.

11. The calculation device according to claim 5,
wherein the positive-side resistor and the negative-side resistor included in each of the M coefficient storage units are resistance change type memories.

12. The calculation device according to claim 4,
wherein the M input values, the M coefficients, and the output value are binary values.

* * * * *